(12) United States Patent
Yamaguchi

(10) Patent No.: US 6,686,963 B1
(45) Date of Patent: Feb. 3, 2004

(54) METHOD FOR DRIVING SOLID-STATE IMAGE DEVICE

(75) Inventor: Takumi Yamaguchi, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/545,631

(22) Filed: Apr. 7, 2000

(30) Foreign Application Priority Data

Apr. 8, 1999 (JP) .............................. 11-100731

(51) Int. Cl.⁷ ..................... H04N 5/335; H01L 27/148
(52) U.S. Cl. ............................. 348/311; 257/242
(58) Field of Search ............................ 257/291, 292, 257/297, 242, 233, 232, 222; 348/311–323

(56) References Cited

U.S. PATENT DOCUMENTS

| | | | |
|---|---|---|---|
| 4,663,771 A | * | 5/1987 | Takeshita et al. ............. 377/58 |
| 5,675,158 A | | 10/1997 | Lee |
| 6,141,049 A | * | 10/2000 | Harada ....................... 348/296 |

FOREIGN PATENT DOCUMENTS

| | | | | |
|---|---|---|---|---|
| JP | 7-240505 | 9/1995 | | |
| JP | 9-191009 | 7/1997 | | |
| JP | 08-348810 | * 7/1998 | ......... | H01L/27/148 |
| JP | 10-189936 | 7/1998 | | |

\* cited by examiner

Primary Examiner—Andrew Christensen
Assistant Examiner—Hedley Linton
(74) Attorney, Agent, or Firm—Merchant & Gould P.C.

(57) ABSTRACT

Signal charges are read out from light-receiving portions during a vertical blanking period by applying a read-out voltage pulse to read-out electrodes that are provided separately from vertical transfer electrodes, while signal charges are prevented from leaking from the light-receiving portions during a vertical scanning period by applying a negative voltage to the read-out electrodes. The read-out voltage pulse also is applied to vertical transfer electrodes, whereby signal charges are read out from the light-receiving portions more efficiently. Signal charges are read out from light-receiving portions in a predetermined region by applying a read-out voltage pulse to read-out electrodes while applying a negative voltage to a part of the vertical transfer electrodes.

15 Claims, 22 Drawing Sheets

METHOD FOR DRIVING SOLID-STATE IMAGE DEVICE

FIELD OF THE INVENTION

The present invention relates to a method for driving a solid-state image device. More specifically, the present invention relates to a method for driving a solid-state image device using a charge-coupled device (CCD).

BACKGROUND OF THE INVENTION

A CCD-type solid-state image device is known, which has a structure such that electrodes for reading out signal charges accumulated in photodiodes are provided separately from vertical transfer electrodes. For example, JP 9-191099 A discloses a solid-state image device in which read-out electrodes are provided independently so as to expand a dynamic range. In this solid-state image device, signal charges are read out from photodiodes in odd number columns independently from those read out from photodiodes in even number columns.

In the solid-state image device provided with read-out electrodes independently as described above, as shown in FIG. 22, during a vertical blanking period (between vertical scanning periods during which signal charges are transferred with voltage pulses 102 and 103 applied to vertical transfer electrodes), a voltage pulse 101 for reading out the subsequent signal charges from photodiodes is applied to read-out electrodes. Under the application of the voltage pulse 101, an electric potential $V_C$ in the read-out electrodes rises from a low electric potential $V_L$ to a high electric potential $V_H$. The high electric potential $V_H$ is set to be a positive electric potential higher than a threshold electric potential $V_T$ required for reading out signal charges. On the other hand, the low electric potential $V_L$ is set generally at 0 volt so as to operate the device with a single power source.

It is desired to drive solid-state image devices at a low voltage so as to minimize power consumption. In order to lower the above-mentioned $V_H$ so as to drive the device at a low voltage, it also is required to lower the above-mentioned $V_T$. However, when the threshold electric potential $V_T$ is lowered, signal charges become likely to leak from photodiodes during a vertical scanning period. Furthermore, when signal charges are read out from some of the photodiodes as described above, it is required to prevent leakage of signal charges from photodiodes from which signal charges are not to be read out (non-active photodiodes) during a vertical blanking period. Furthermore, when the device is driven particularly at a low voltage, it is required to read out signal charges with good efficiency.

Furthermore, according to the above-mentioned conventional method, when a subject moving at a high speed is displayed in one image continuously, or when there is a large difference between lightness and darkness, signal charges may overflow photodiodes or vertical charge transfer regions, which makes it difficult to obtain a satisfactory image.

SUMMARY OF THE INVENTION

Therefore, with the foregoing in mind, it is an object of the present invention to provide a method suitable for driving a solid-state image device provided with read-out electrodes independently at a low voltage. More specifically, the first object of the present invention is to provide a method for driving a solid-state image device capable of transferring signal charges stably even at a low voltage. The second object of the present invention is to provide a method for driving a solid-state image device capable of reading out signal charges with good efficiency. The third object of the present invention is to provide a method for driving a solid-state image device capable of reading out signal charges partially with reliability. Furthermore, another object of the present invention is to provide a method for driving a solid-state image device capable of reading out signal charges partially from a predetermined region, so as to be applied to the case where a subject is moving at a high speed or where there is a large difference between lightness and darkness.

According to a method for driving a solid-state image device of the present invention, using a solid-state image device including:

a plurality of light-receiving portions formed in a semiconductor substrate in a matrix having a plurality of rows and columns;

a plurality of vertical charge transfer regions formed in the semiconductor substrate so as to extend between the light-receiving portions along the columns thereof;

a plurality of vertical transfer electrodes disposed on the semiconductor substrate so as to apply a voltage for transferring signal charges in the vertical charge transfer regions in a column direction;

a plurality of charge read-out control regions formed in the semiconductor substrate between the light-receiving portions and the vertical charge transfer regions; and a plurality of read-out electrodes disposed on the semiconductor substrate so as to apply a voltage to the charge read-out control regions, for reading out signal charges accumulated in the light-receiving portions from the light-receiving portions to the vertical charge transfer regions via the charge read-out control regions, basically signal charges accumulated in the light-receiving portions are read out to the vertical charge transfer regions via the charge read-out control regions by applying a read-out voltage pulse to the read-out electrodes during a first period; and the signal charges in the vertical charge transfer regions are transferred in the column direction by applying a transfer voltage pulse to the vertical transfer electrodes during a second period.

According to the first driving method of the present invention, a negative voltage is applied to the read-out electrodes at least during the second period.

According to the above-mentioned method for driving a solid-state image device, leakage of signal charges during the second period (vertical scanning period) in which signal charges are transferred vertically is prevented by the application of a negative voltage to the read-out electrodes. Therefore, signal charges can be transferred stably even when a threshold electric potential $V_T$ is lowered, for example, so as to drive the device at a low voltage.

According to the above-mentioned first driving method, the read-out electrodes may be held at an intermediate electric potential that is lower than a peak electric potential of the read-out voltage pulse and higher than an electric potential of the negative voltage applied to the read-out electrodes during at least a part of the first period (vertical blanking period).

According to a second driving method, signal charges accumulated in the light-receiving portions are read out to the vertical charge transfer regions via the charge read-out control regions by applying a first read-out voltage pulse to the read-out electrodes and applying a second read-out voltage pulse to the vertical transfer electrodes during a first period, and furthermore, a voltage of the first read-out voltage pulse is set to be lower than a voltage of the second read-out voltage pulse.

Furthermore, according to a third driving method of the present invention, signal charges accumulated in the light-receiving portions are read out to the vertical charge transfer regions via the charge read-out control regions by applying a first read-out voltage pulse to the read-out electrodes and applying a second read-out voltage pulse to the vertical transfer electrodes during a first period, and application of the first read-out voltage pulse is completed while the second read-out voltage pulse is applied.

According to the above-mentioned second and third driving methods, a potential gradient in the charge read-out control regions during read-out of signal charges can be rendered suitable for reading out signal charges efficiently. Thus, signal charges can be read out with good efficiency even at a low voltage.

According to the above-mentioned second and third driving methods, it is preferable that a second pulse is applied to the vertical transfer electrodes that are disposed so as to spread over a part of the charge read-out control regions as well as the vertical charge transfer regions.

According to a fourth driving method of the present invention, signal charges accumulated in at least a part of the light-receiving portions are read out to the vertical charge transfer regions via the charge read-out control regions by applying a read-out voltage pulse to at least a part of the read-out electrodes during a first period, the signal charges in the vertical charge transfer regions are transferred in the column direction by applying a transfer voltage pulse to the vertical transfer electrodes during a second period, and when the read-out voltage pulse is applied during the first period, a negative voltage is applied to at least one electrode group selected from the read-out electrodes excluding read-out electrodes to which the read-out voltage pulse is applied and a part of the vertical transfer electrodes.

According to the fourth driving method, signal charges can be read out partially in a stable manner.

According to a fifth driving method of the present invention, a solid-state image device is used, in which read-out electrodes are arranged so as to be orthogonal to an arrangement of vertical transfer electrodes. When the read-out voltage pulse is applied during the first period, a negative voltage is applied to a part of the vertical transfer electrodes, thereby preventing read-out of signal charges from a part of the light-receiving portions, while allowing signal charges to be read out from a part of the light-receiving portions that form a predetermined row group, and the read-out voltage pulse is applied to a part of the read-out electrodes that form a predetermined column group, whereby the signal charges are read out from a part of the light-receiving portions in a predetermined region determined as a position where the predetermined row group crosses the predetermined column group.

According to the above-mentioned fifth driving method, signal charges can be read out from only the light-receiving portions that are present in a predetermined region in a matrix.

According to the above-mentioned fifth driving method, while the predetermined region for reading out signal charges is moved, the signal charges may be read out from the predetermined region. According to the fifth driving method, since signal charges are read out from a predetermined region, not from a predetermined column (row), this region can be moved in an arbitrary direction.

Furthermore, according to the above-mentioned fifth driving method, a plurality of predetermined regions having different accumulation times for signal charges may be set. According to the fifth driving method, an accumulation time for signal charges can be set for each region. Therefore, an accumulation time can be set, for example, in accordance with lightness and darkness (amount of incident light) in a region.

PREFERRED EMBODIMENTS OF THE INVENTION

Hereinafter, the present invention will be described by way of preferred embodiments with reference to the drawings.

Embodiment 1

Figure 1:
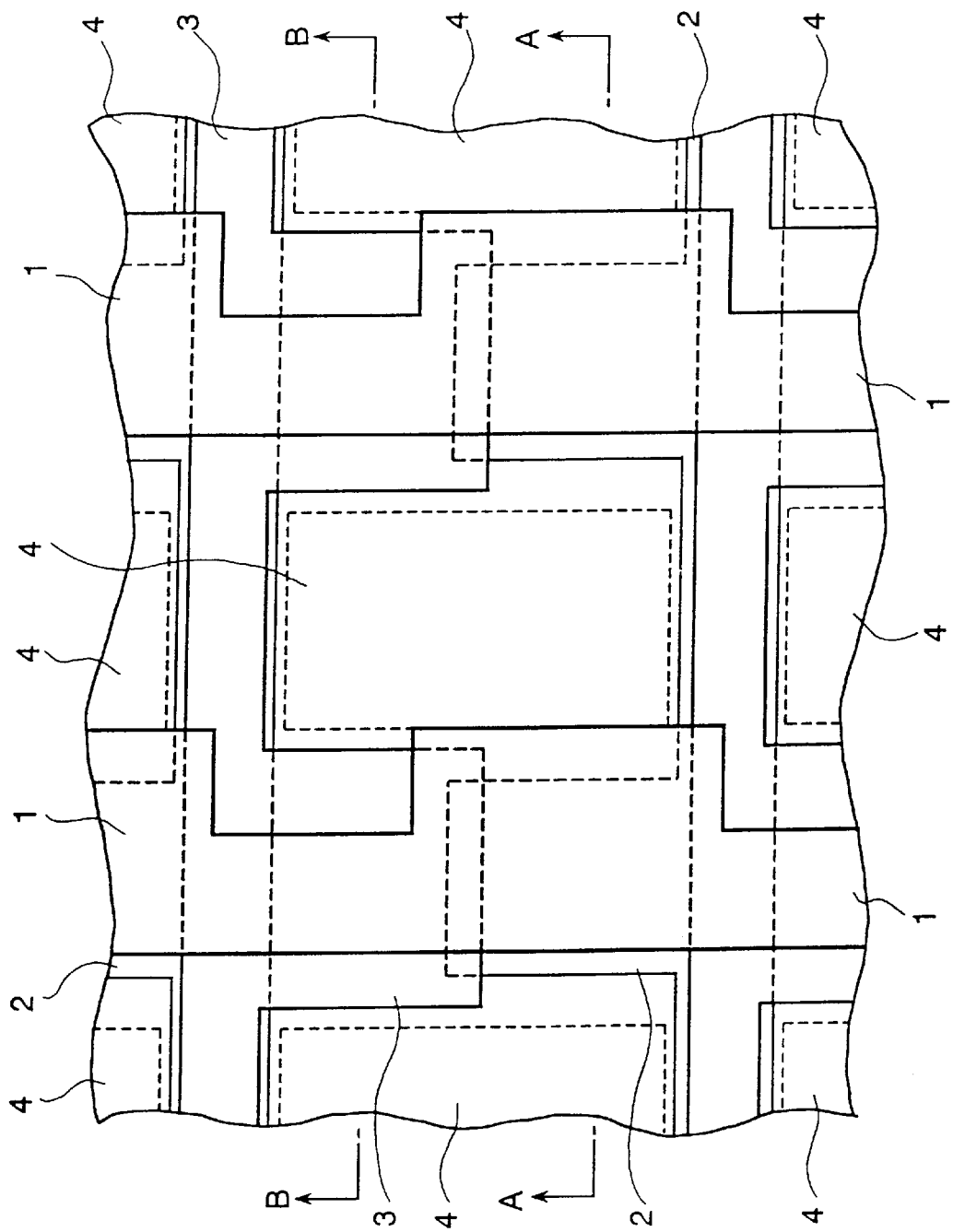
FIG. 1 is a plan view showing an embodiment of a solid-state image device used in the present invention.
Figure 2:
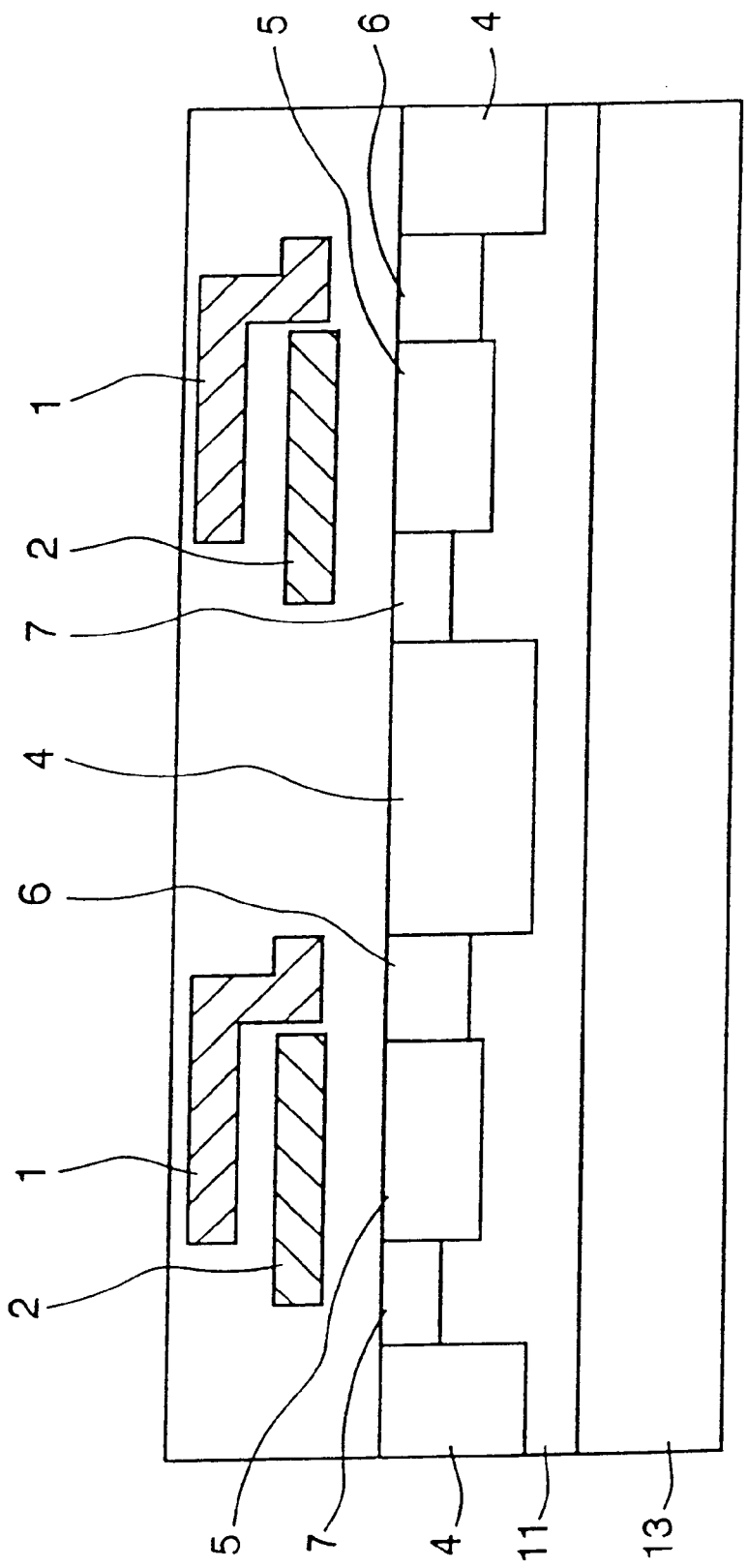
FIG. 2 is a cross-sectional view of the solid-state image device in FIG. 1 taken along A—A.
Figure 3:
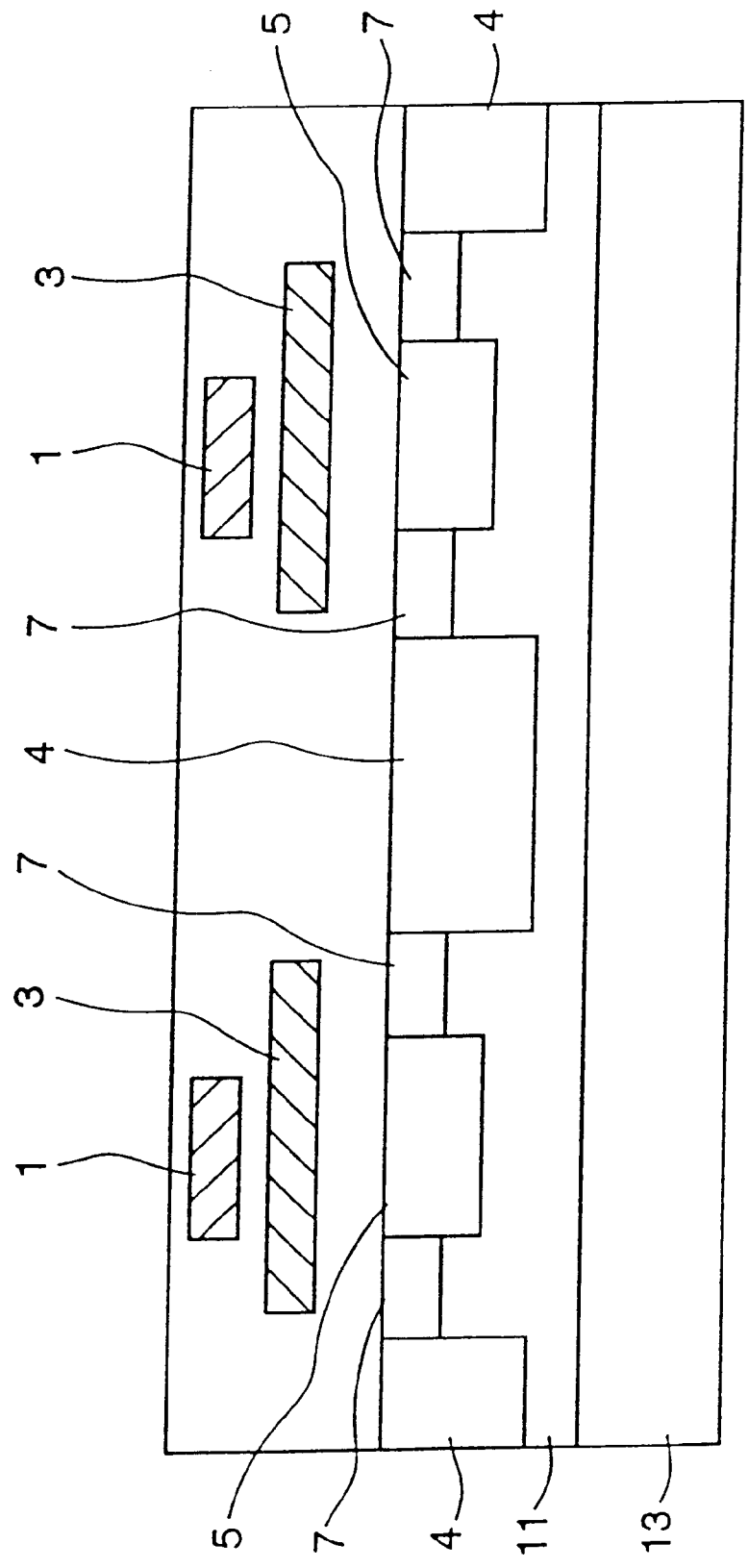
FIG. 3 is a cross-sectional view of the solid-state image device in FIG. 1 taken along B—B.

As shown in FIGS. 1 to 3, in a solid-state image device used in the present embodiment, photodiodes 4 having a photoelectric exchange function are formed in a semiconductor substrate so as to be arranged regularly in rows and columns (in other words, in a matrix so that they are apart from each other). Furthermore, as shown in FIGS. 2 and 3 (not shown in FIG. 1), vertical charge transfer regions (vertical charge transfer channels) 5 are formed in the semiconductor substrate, which extend between and along the photodiodes 4 in a column direction (vertical direction in FIG. 1). Furthermore, charge read-out control regions 6 and isolation regions 7 are respectively formed between the vertical charge transfer regions 5 and the photodiodes 4 in the semiconductor substrate.

In the present embodiment, the photodiodes 4, the vertical charge transfer regions 5, the charge read-out control regions 6, and the isolation regions 7 are disposed in a p-type well layer 11 provided on an n-type silicon substrate 13. In this case, the photodiodes 4 and the vertical charge transfer regions 5 are formed as n-type impurity diffusion regions, and the charge read-out control regions 6 and the isolation regions 7 are formed as p-type impurity diffusion regions (the p-type well layer, the charge read-out control regions, and the isolation regions are formed as a p⁻-region, p-regions, and p⁺-regions, respectively).

First vertical transfer electrodes 2 and second vertical transfer electrodes 3 are disposed above the vertical charge transfer regions 5 for the purpose of transferring signal charges in the vertical charge transfer regions 5. Although two-layered vertical transfer electrodes are used in the present embodiment, three or more layers of electrodes may be used. Read-out electrodes 1 are disposed above the charge read-out control regions 6.

Figure 4:
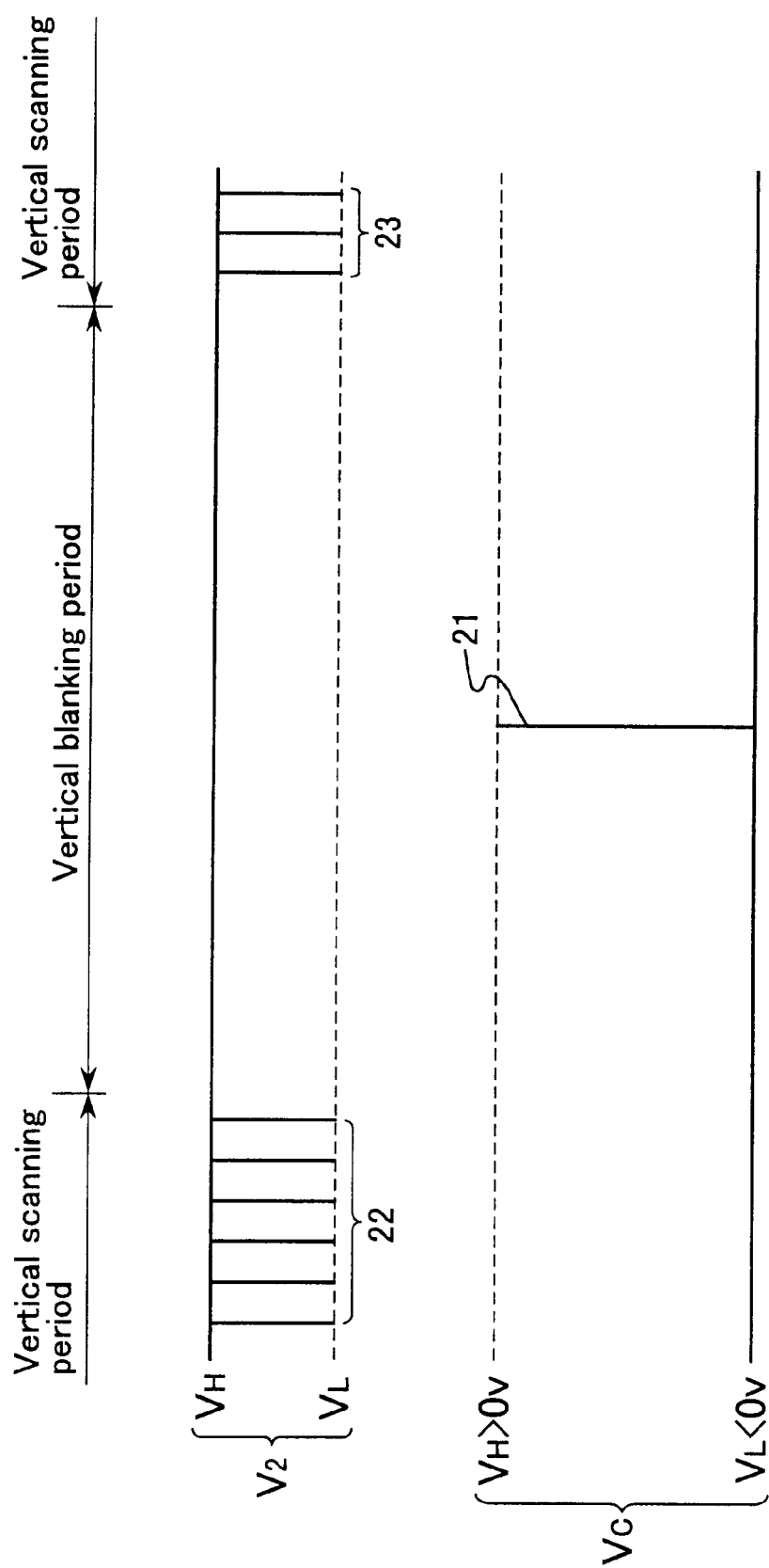
FIG. 4 shows application patterns of voltage pulses in an embodiment of a method for driving a solid-state image device of the present invention.

Next, referring to FIG. 4, a method for driving the above-mentioned solid-state image device will be described.

Figure 22:
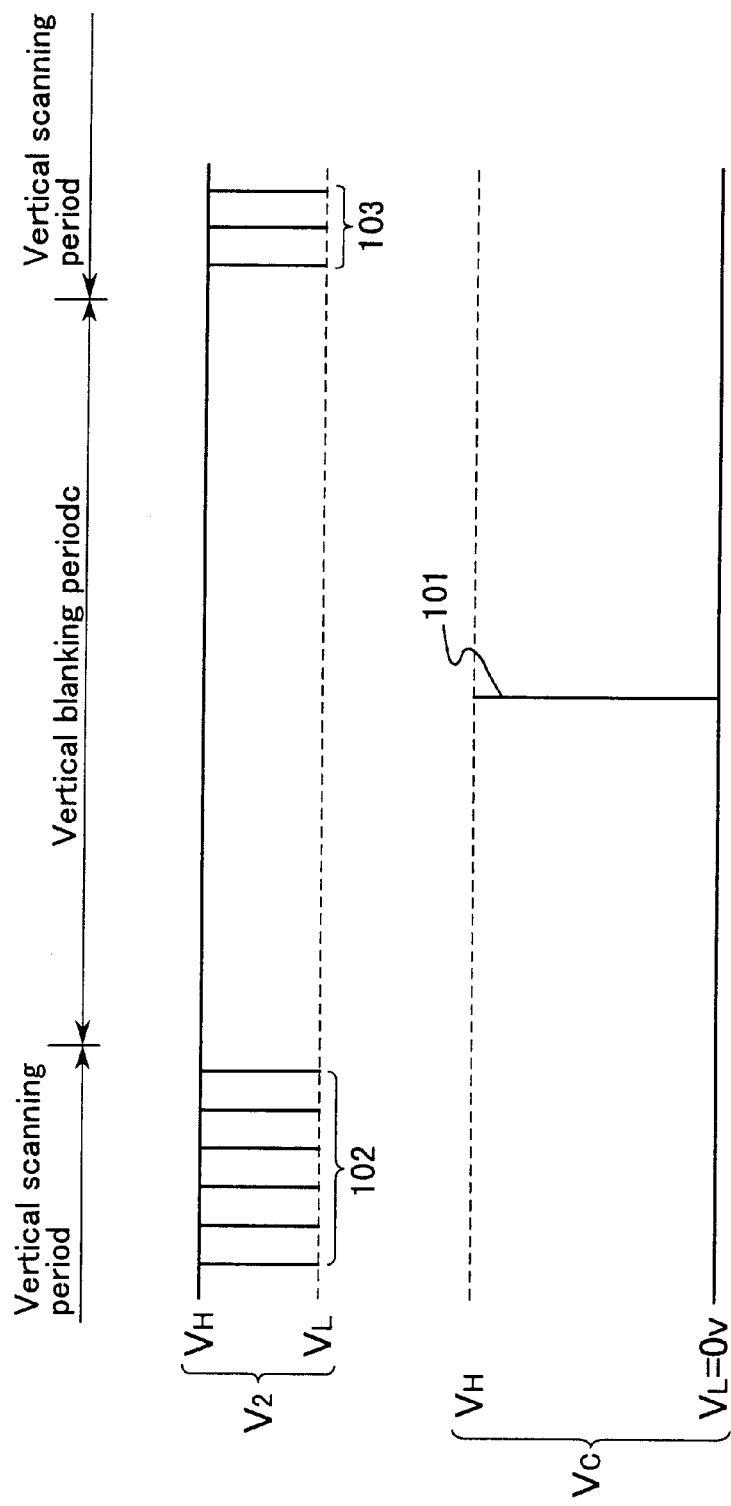
FIG. 22 shows application patterns of voltage pulses in a conventional method for driving a solid-state image device.

Signal charges read out from the photodiodes 4 to the vertical charge transfer regions 5 during a vertical blanking period are transferred (vertically) in the vertical charge transfer regions 5 in the column direction of the photodiodes 4 with a transfer voltage pulse 22 having a predetermined pattern that rises and falls between a high electric potential $V_H$ and a low electric potential $V_L$. During vertical transfer, predetermined voltage pulses are applied to the vertical transfer electrodes, respectively. In the same way as in FIG. 22, FIG. 4 shows only an electric potential $V_2$ in the first vertical transfer electrodes 2. The transfer voltage pulses 22 and 23 are applied, for example, under the condition of a high electric potential $V_H$ of 0 volt and a low electric potential $V_L$ of –7 volts.

The vertical scanning period includes a horizontal scanning period and a horizontal blanking period. During the horizontal scanning period, signal charges that have been transferred vertically are transferred horizontally between the respective transfer voltage pulses 22. During the horizontal blanking period, a signal line retraces in the image horizontal direction.

During the vertical scanning period, an electric potential $V_C$ of the read-out electrodes 1 is held at a low electric potential $V_L$ (negative electric potential). More specifically, during the vertical scanning period, a negative voltage is applied to the read-out electrodes 1 from a power source (not shown).

During a vertical blanking period in which a signal line retraces in the image vertical direction, a read-out voltage pulse 21 is applied to the read-out electrodes 1. Because of the application of the read-out voltage pulse 21, signal charges accumulated in the photodiodes 4 are read out to the vertical charge transfer regions 5 via the charge read-out control regions 6. A peak electric potential $V_H$ of the read-out voltage pulse 21 is set to be a positive electric potential higher than a threshold electric potential $V_T$ for reading out charges.

Thereafter, during the subsequent vertical scanning period, the signal charges read out with the read-out voltage pulse 21 are transferred in the vertical charge transfer regions 5 with a transfer voltage pulse containing a voltage pulse 23 applied to the first vertical transfer electrodes 2 in the same way as above. During this vertical scanning period, a negative voltage is applied to the read-out electrodes 1, and held at the negative electric potential $V_L$. The read-out voltage pulse 21 is applied, for example, under the condition of a high electric potential $V_H$ of 15 volts and a low electric potential $V_L$ of –7 volts.

In the present embodiment, the electric potential $V_L$ of the read-out electrodes 1 during the vertical scanning period is set to be negative. Therefore, even if the threshold electric potential $V_T$ required for reading out signal charges via the charge read-out control regions 6 is lowered, leakage of signal charges from the photodiodes 4 can be prevented. Accordingly, even if the peak electric potential $V_H$ of the electric potential $V_C$ in the read-out electrodes 1 is lowered, signal charges can be transferred stably.

In the present embodiment, it is attempted to decrease the resistance of a plurality of read-out electrodes 1 extending in the same direction so as to drive the device more advantageously at a low voltage. More specifically, as shown in FIGS. 2 and 3, the read-out electrodes 1 are formed so as to spread over the vertical transfer electrodes 2 and 3, as well as the charge read-out control regions 6. When the resistance of the read-out electrodes 1 is decreased as such, fluctuation of a waveform of the read-out voltage pulse can be minimized. Accordingly, it is not required to increase a voltage in order to prevent fluctuation of a pulse waveform. As described above, the above-mentioned structure (i.e., the read-out electrodes 1 are disposed above at least a part of the vertical transfer electrodes 2 and 3) is particularly effective for driving, at a low voltage, a solid-state image device in which the width of the charge read-out control regions 6 is limited due to miniaturization and a larger number of pixels.

Figure 5:
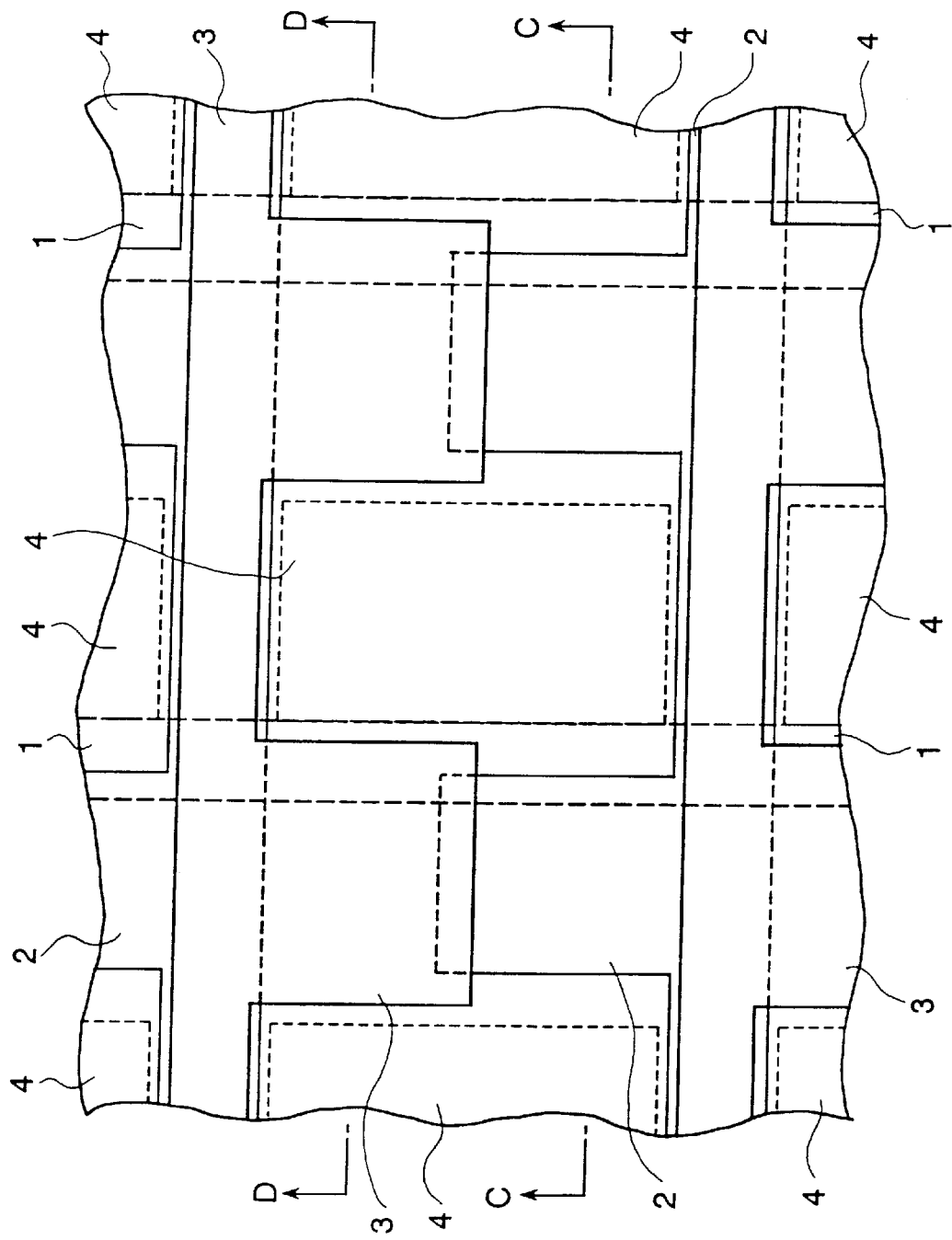
FIG. 5 is a plan view showing another embodiment of a solid-state image device used in the present invention.
Figure 6:
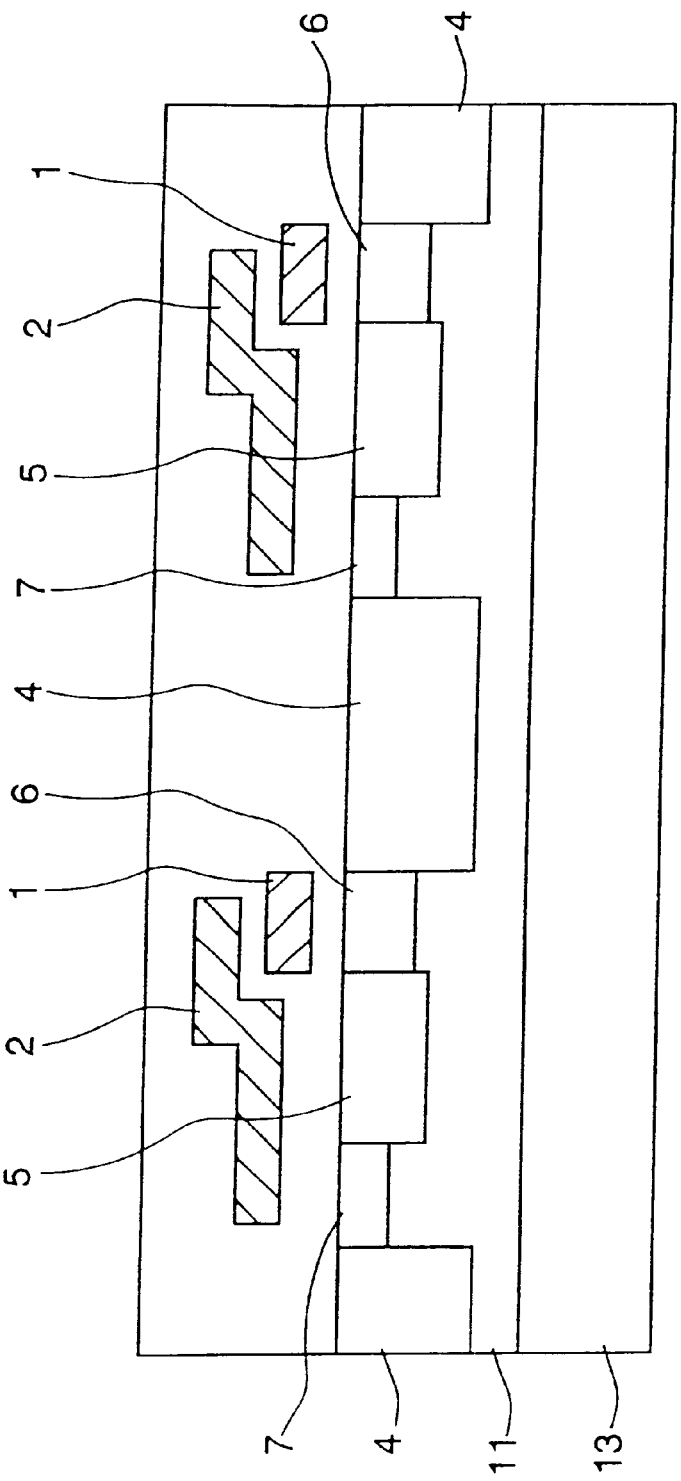
FIG. 6 is a cross-sectional view of the solid state image device in FIG. 5 taken along C—C.
Figure 7:
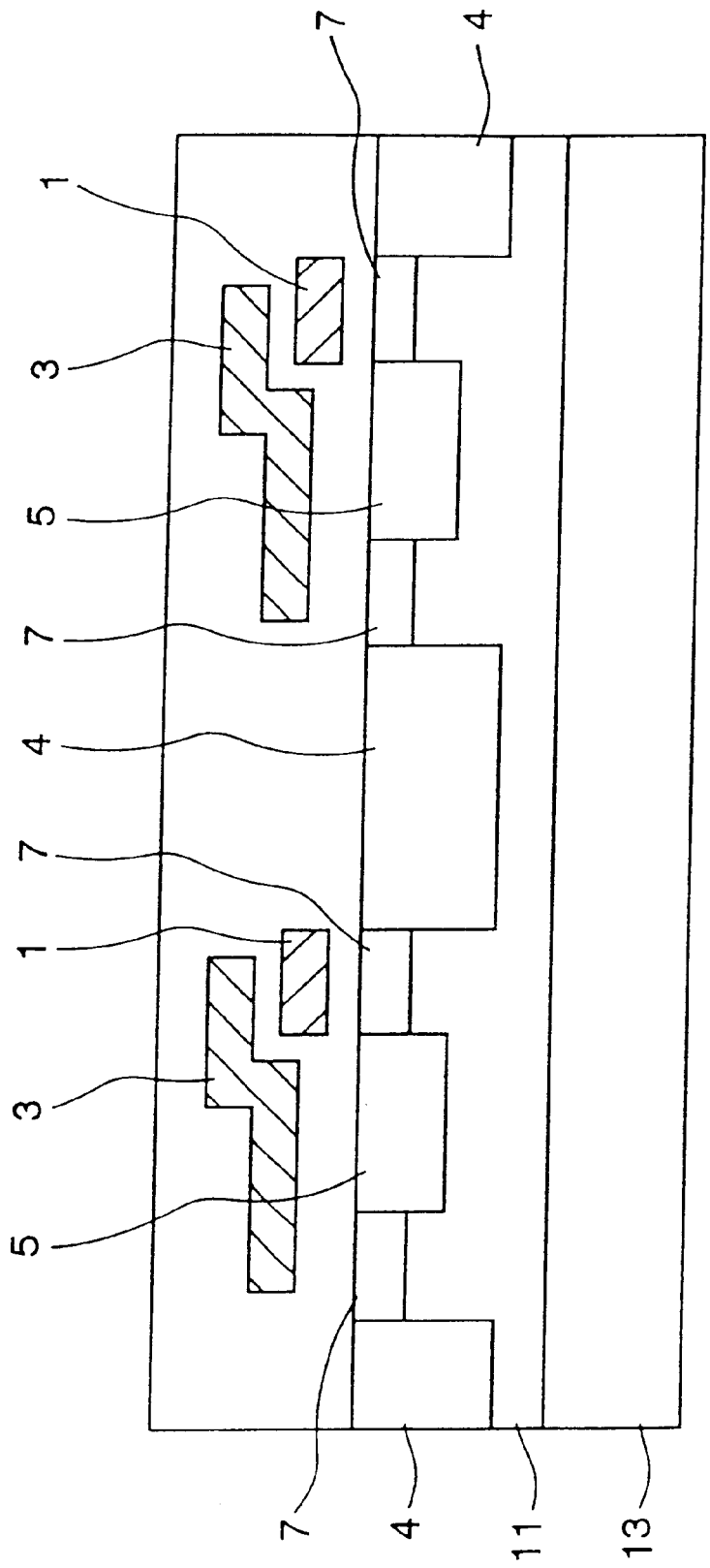
FIG. 7 is a cross-sectional view of the solid state image device in FIG. 5 taken along D—D.

The driving method of the present invention is not limited to the above-mentioned structure. The driving method of the present invention is applicable to any solid-state image device in which read-out electrodes are provided independently. For example, even in a solid-state image device having a structure in which the read-out electrodes 1 are provided below the vertical transfer electrodes 2 and 3 as shown in FIGS. 5 to 7, the above-mentioned driving method is effective for decreasing a driving voltage of the solid-state image device.

Embodiment 2

In the present embodiment, another method for driving the solid-state image device shown in the above-mentioned embodiment will be described.

Figure 8:
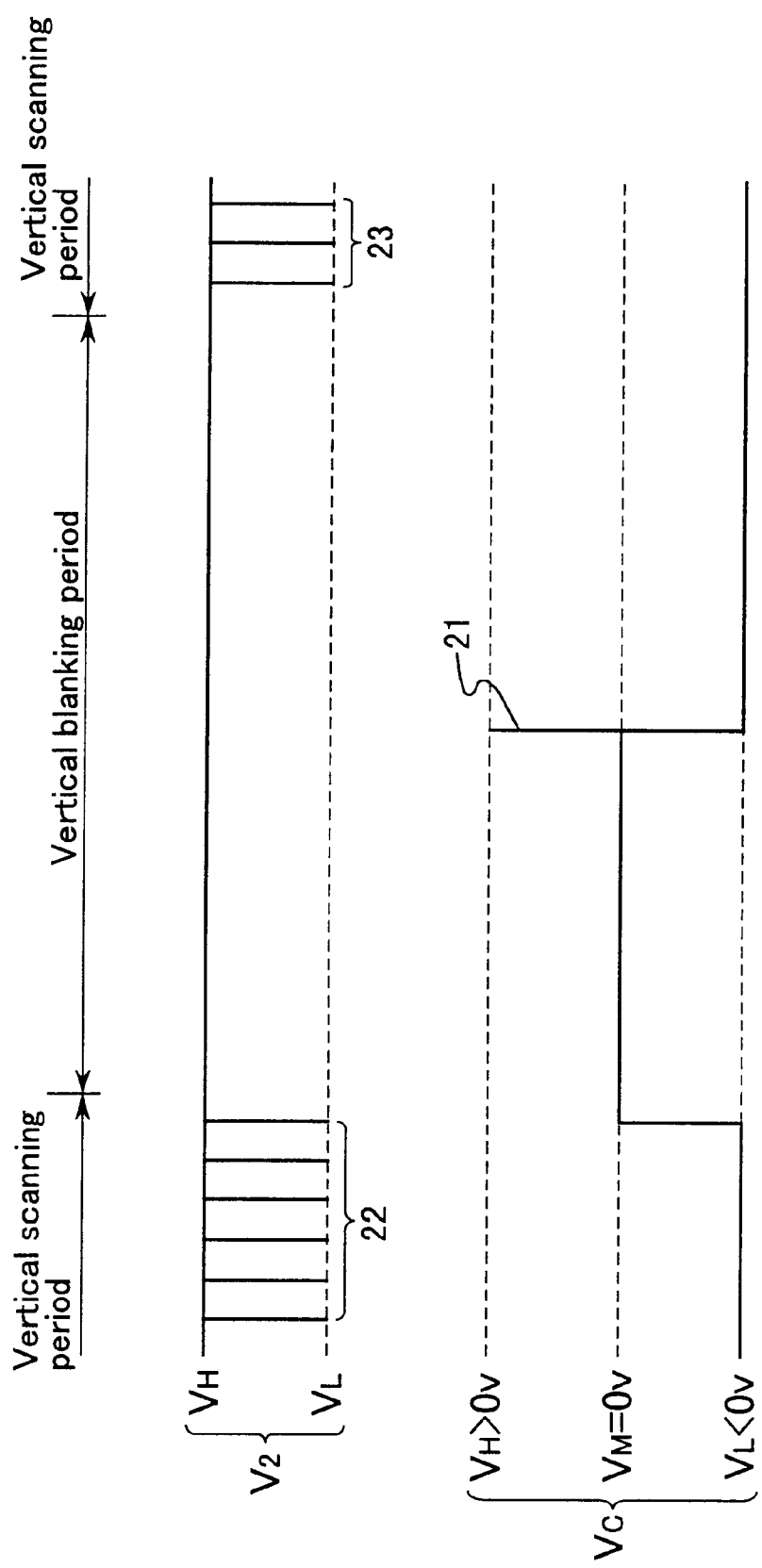
FIG. 8 shows application patterns of voltage pulses in another embodiment of a method for driving a solid-state image device of the present invention.

As shown in FIG. 8, the driving method of the present embodiment is the same as that shown in Embodiment 1, except that the electric potential $V_C$ in the read-out electrode 1 is held at an intermediate electric potential $V_M$ during a vertical blanking period until the read-out voltage pulse 21 is applied. The intermediate electric potential $V_M$ is set at 0 volt, for example.

When the electric potential $V_C$ is held at the intermediate electric potential $V_M$, the difference between the electric potential $V_T$ and the electric potential $V_C$ thus set becomes smaller. Therefore, signal charges become likely to leak from photodiodes, compared with Embodiment 1 in which the electric potential $V_C$ is held at the negative electric potential $V_L$ even during the vertical blanking period, except for the time when the read-out voltage pulse is applied. However, signal charges leaking to the vertical charge transfer regions during a period until the read-out voltage pulse 21 is applied are those to be read out with the read-out voltage pulse 21; therefore, they do not become unnecessary charges. By using such an embodiment actively, it becomes possible to accumulate signal charges without being limited by the capacity of the photodiodes 4.

Figure 9:
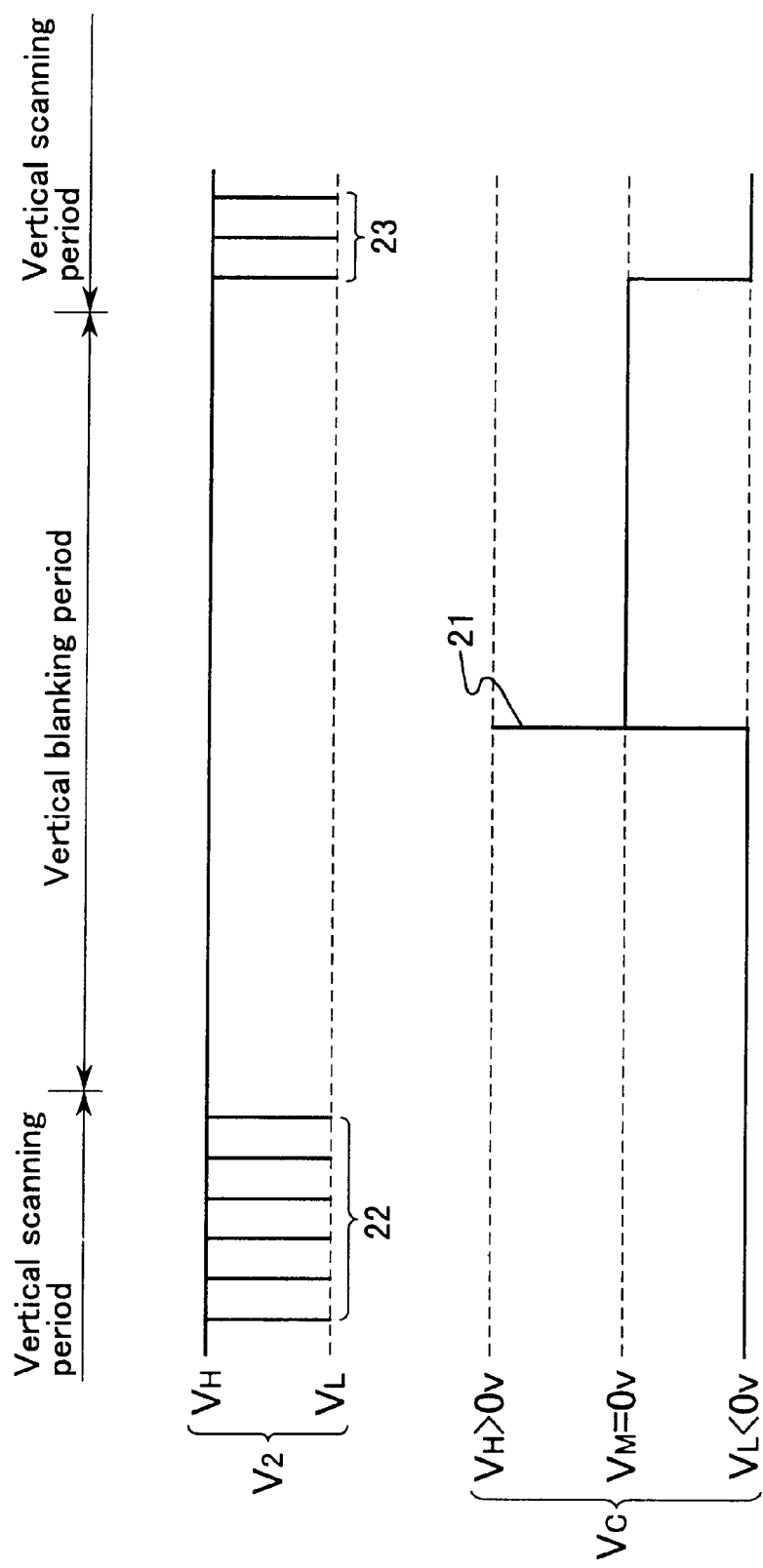
FIG. 9 shows application patterns of voltage pulses in still another embodiment of a method for driving a solid-state image device of the present invention.

The electric potential $V_C$ should be held at the intermediate electric potential $V_M$ before or after the application of the read-out voltage pulse 21 during the vertical blanking period. For example, as shown in FIG. 9, the electric potential $V_C$ may be held at the intermediate electric potential $V_M$ after the application of the read-out voltage pulse 21 during the vertical blanking period.

Embodiment 3

In the present embodiment, a still another method for driving the solid-state image device shown in the above-mentioned embodiments will be described. In the above-mentioned embodiments, the case has been described in which signal charges are transferred stably. Herein, a driving method for reading out signal charges efficiently will be described.

Figure 10:
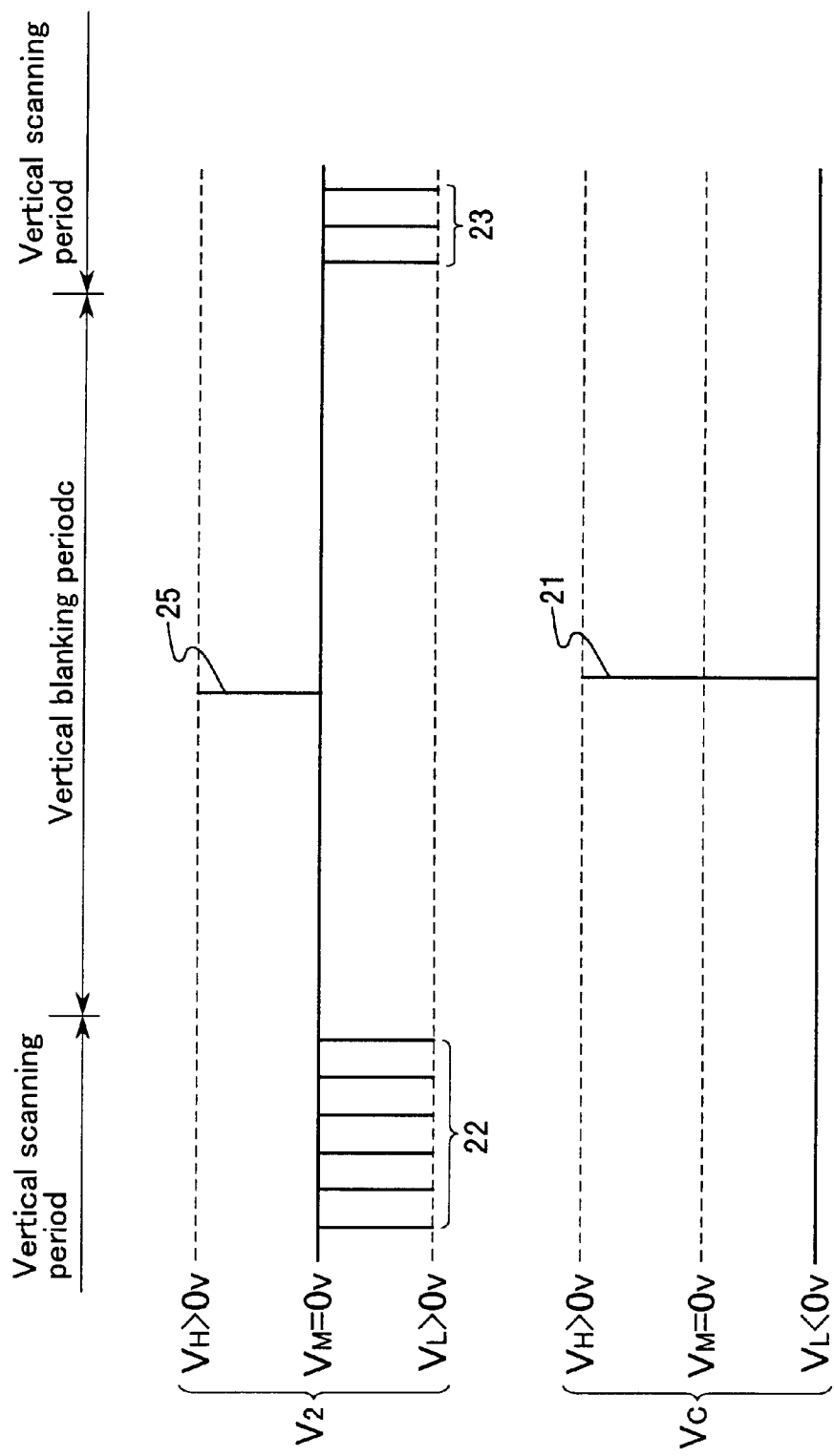
FIG. 10 shows application patterns of voltage pulses in still another embodiment of a method for driving a solid-state image device of the present invention.

As shown in FIG. 10, according to the driving method of the present embodiment, the first vertical transfer electrodes 2 also are supplied with a voltage pulse 25 for reading out signal charges from the photodiodes 4. Because of the voltage pulse 25, signal charges are read out from the photodiodes 4 efficiently.

In the embodiment shown in FIG. 10, the transfer voltage pulses 22 and 23 are applied as negative voltage pulses. On the other hand, the read-out electrode pulses 21 and 25 are applied as positive voltage pulses.

Figure 11:
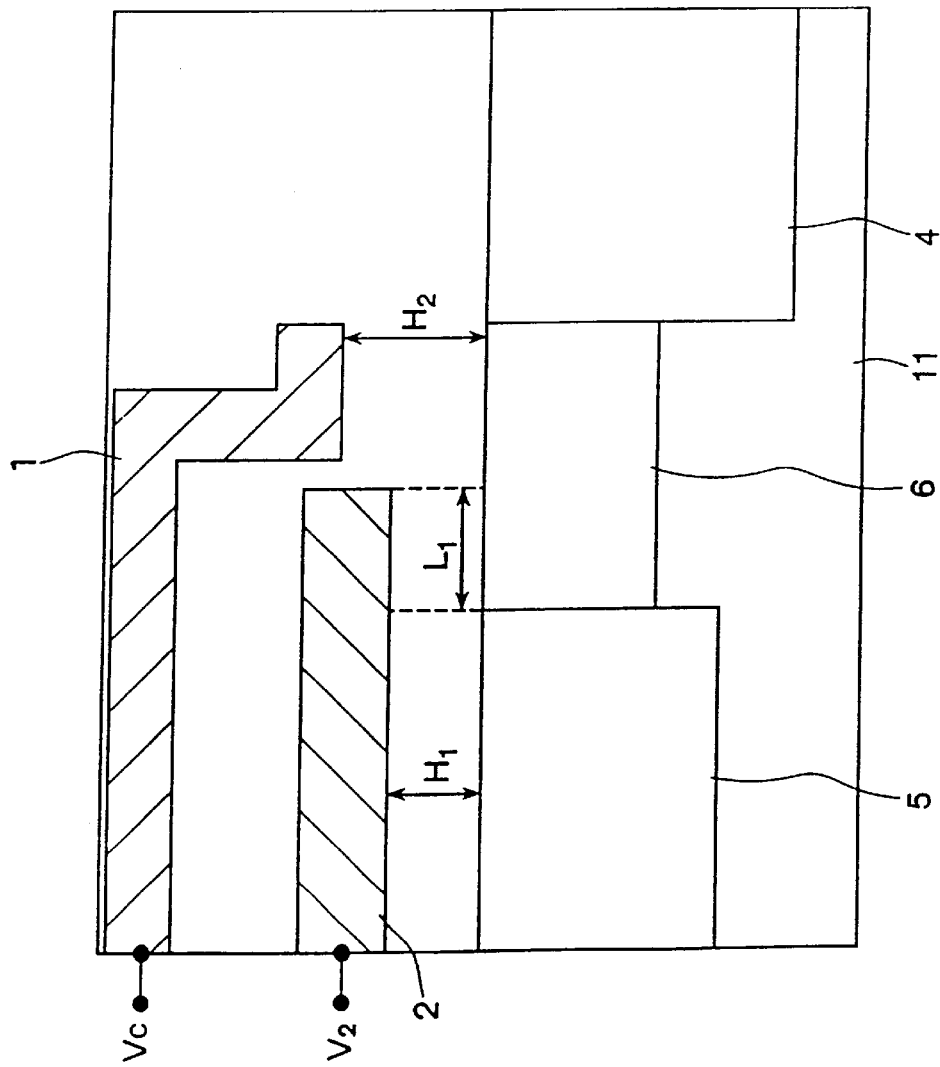
FIG. 11 is an enlarged cross-sectional view showing the vicinity of a charge read-out control region in an embodiment of a solid-state image device used in the present invention.

When such a driving method is conducted, as shown in FIG. 11, it is preferable that the vertical transfer electrode 2 is formed so as to spread over a part of the charge read-out control region 6, as well as the vertical charge transfer region 5. This is because the read-out voltage pulse 25 applied to the vertical transfer electrode 2 allows a difference in level or a gradient to be formed in a potential of the charge read-out control region 6.

In order to allow the low electric potential $V_L$ applied to the read-out electrodes 1 to function effectively so as to prevent leakage of signal charges during the vertical scanning period, it is preferable that an overlapping width $L_1$, between the vertical transfer electrode 2 and the charge read-out control region 6 in a charge read-out direction (i.e., direction orthogonal to the vertical transfer direction; right-and-left direction in FIG. 11) should be set at a half of the width or less of the charge read-out control region 6 in the same direction.

Furthermore, assuming that the distance between the surface of the semiconductor substrate and the lower end of the vertical transfer electrode 2 and the distance between the surface of the semiconductor substrate and the lower end of the read-out electrode 1 are $H_1$ and $H_2$, respectively, it is preferable to place these electrodes so as to satisfy $H_1 < H_2$ (FIG. 11) for the following reason. If there is a difference in distance between these electrodes and the charge read-out control region 6, even when the same electric potential is applied to these electrodes, the potential in the charge read-out control region 6 can be adjusted so as to be advantageous for reading out signal charges from the photodiodes 4 efficiently.

Figure 12:
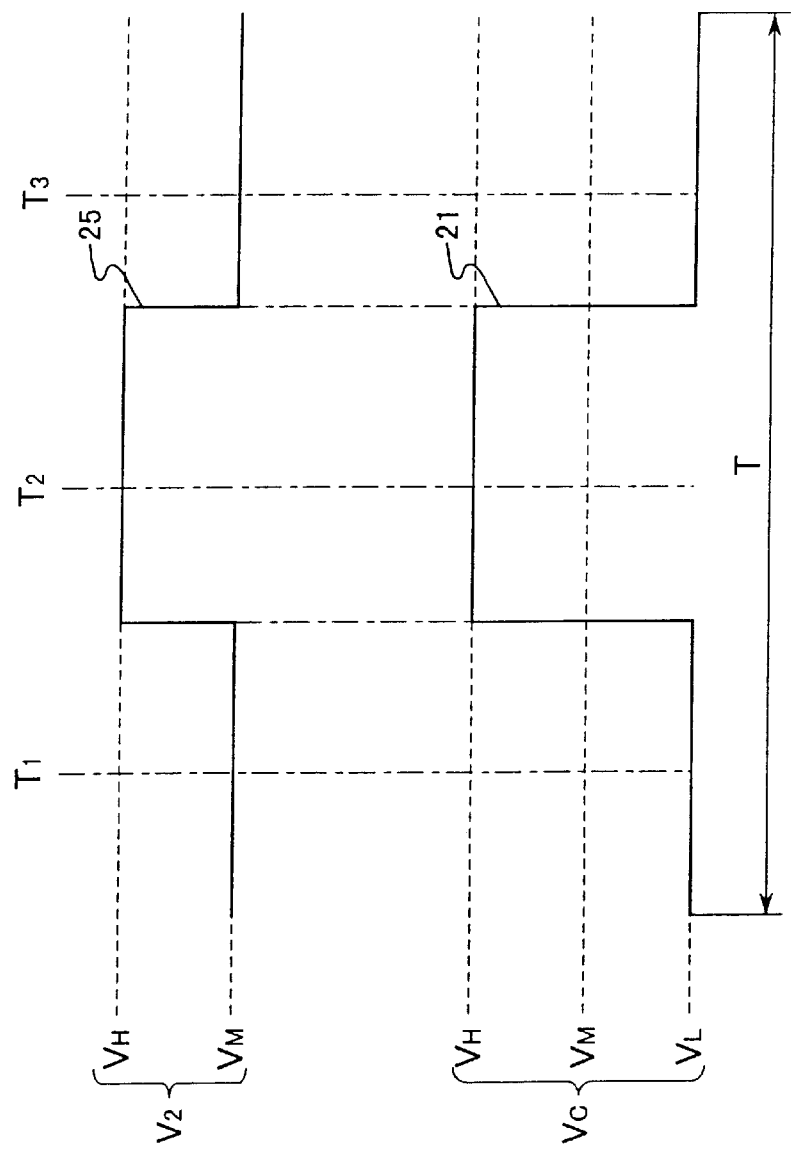
FIG. 12 is an enlarged view of the vicinity of an application period (T) of the read-out voltage pulses in the application patterns shown in FIG. 10.
Figure 13:
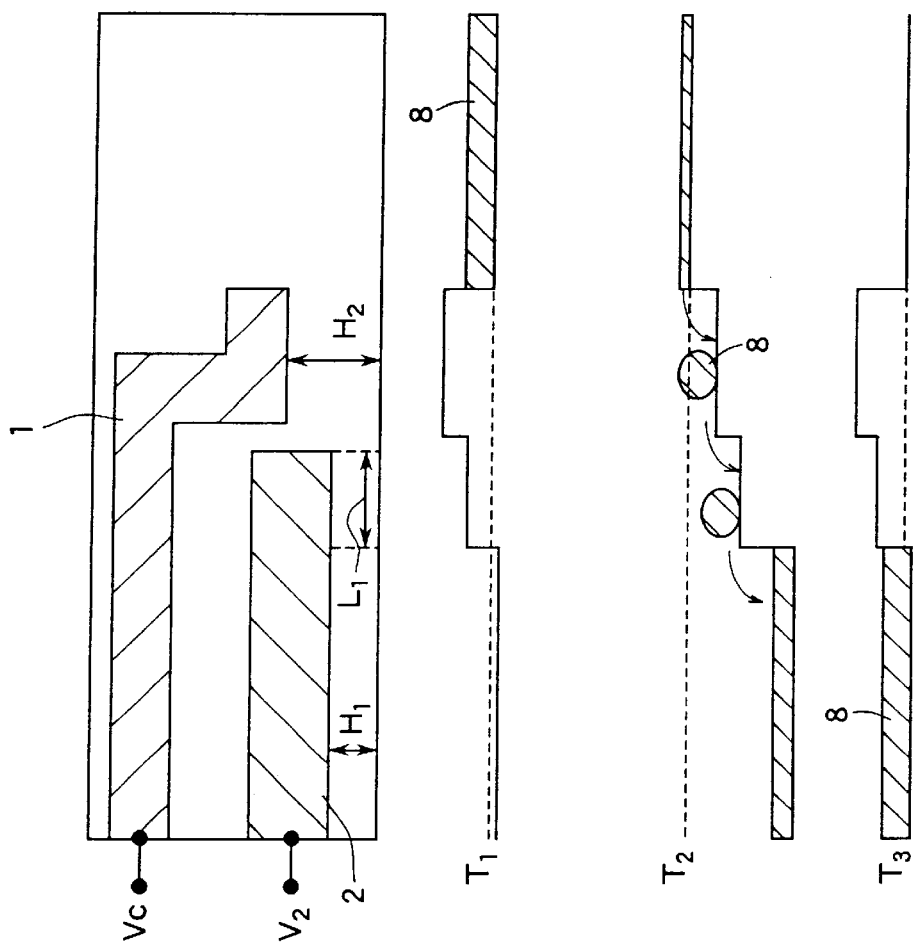
FIG. 13 shows a potential state in a charge read-out control region when the patterns in FIGS. 10 and 12 are applied to the solid-state image device shown in FIG. 11.

More specifically, when the read-out voltage pulses 21 and 25 are applied to the read-out electrode 1 and the vertical transfer electrode 2 in the solid-state image device having a structure shown in FIG. 11, the potential in the charge read-out control region 6 becomes high on the side of the vertical charge transfer region under the application of both the voltage pulses (Time $T_2$), as shown in FIGS. 12 and 13. Such a potential shape is preferable for reading out signal charges 8 efficiently, in particular, at a low voltage.

If the relationship in size between the peak electric potential $V_H$ in the read-out voltage pulse 21 and the peak electric potential $V_H$ in the read-out voltage pulse 25 is adjusted, similar effects can be obtained irrespective of the relationship in size between $H_1$ and $H_2$. More specifically, $V_H$ of the read-out voltage pulse 25 applied to the vertical transfer electrode should be set higher than $V_H$ of the read-out voltage pulse 21 applied to the read-out electrode in such a manner as to obtain a potential shape similar to that in FIG. 13. Furthermore, even when the vertical transfer electrode 2 does not overlap the charge read-out control region 6 (i.e., $L_1 = 0$), the effects similar to the above can be obtained by utilizing a fringing field caused by the read-out voltage pulse 25 applied to the vertical transfer electrode 2.

Figure 14:
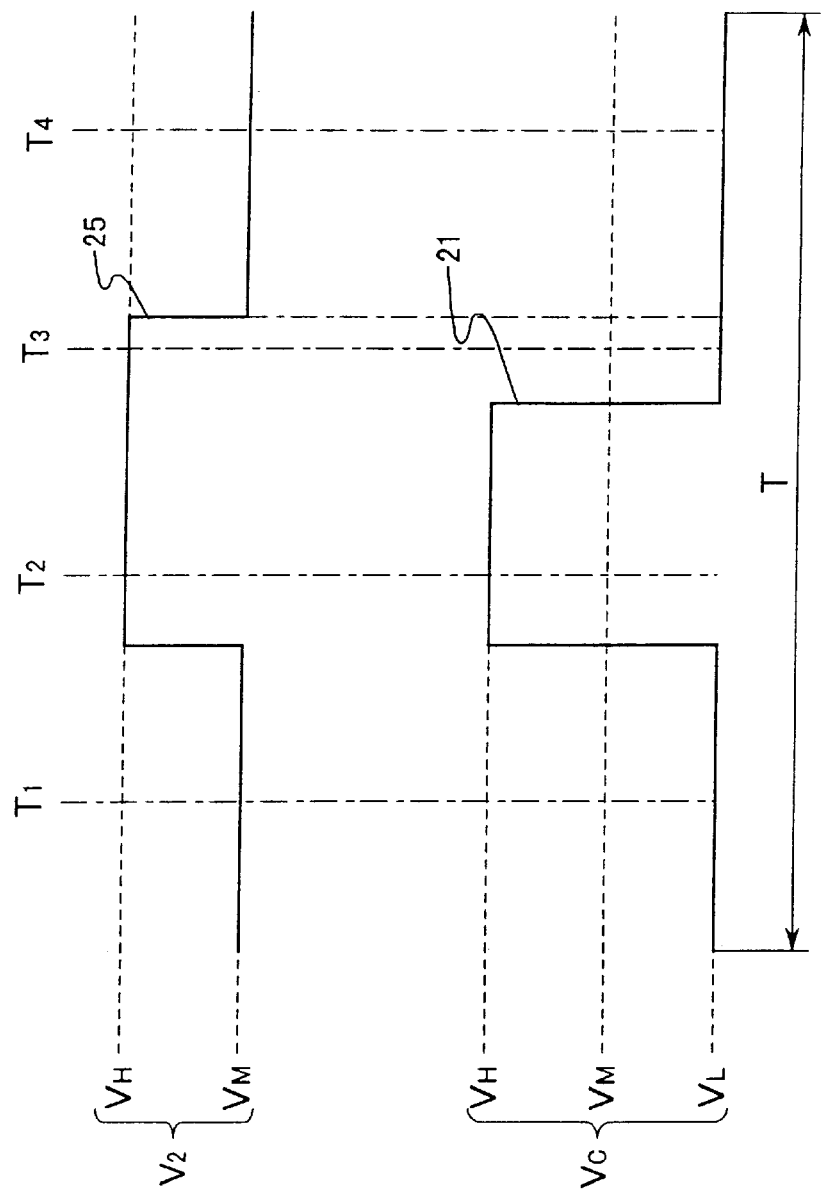
FIG. 14 shows application patterns of voltage pulses in still another embodiment of a method for driving a solid-state image device of the present invention.
Figure 15:
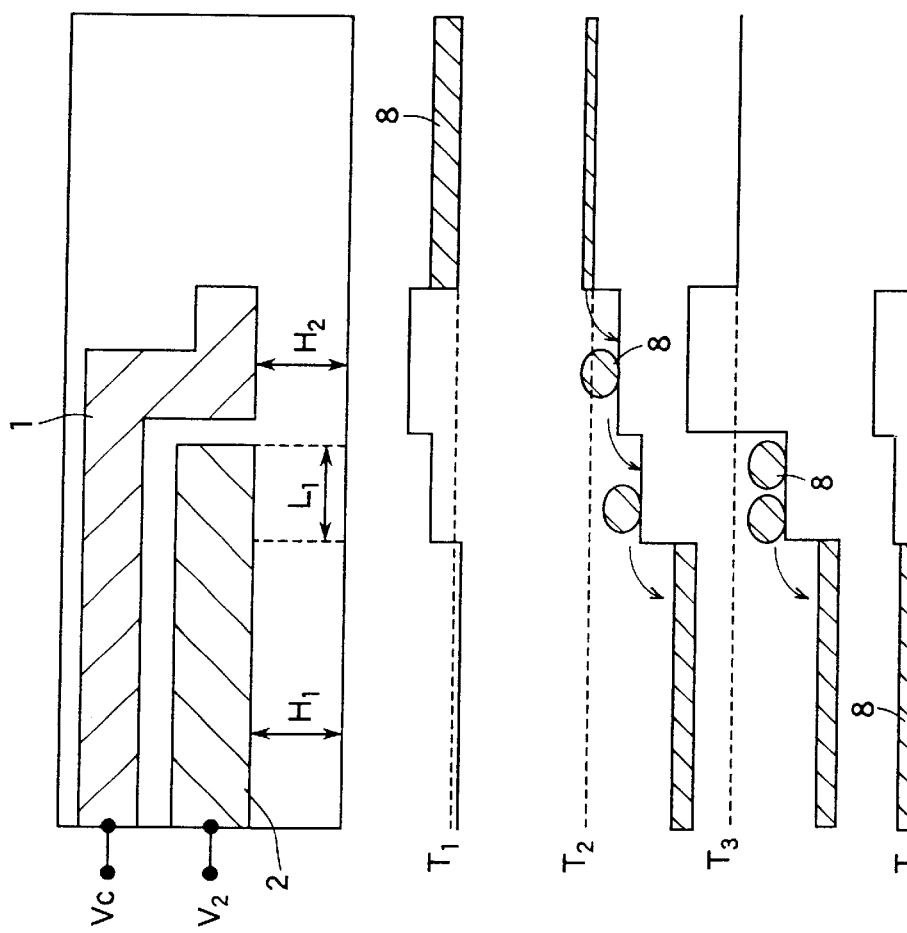
FIG. 15 shows a potential state of a charge read-out control region when the patterns shown in FIG. 14 are applied to the solid-state image device shown in FIG. 11.

In order to read out signal charges efficiently, as shown in FIG. 14, the application of the voltage pulse 21 to the read-out electrodes may be completed while the voltage pulse 25 is applied to the vertical transfer electrodes. By allowing the trailing edge of the read-out voltage pulse 21 to come earlier than that of the read-out voltage pulse 25, a period during which only the read-out voltage pulse 25 is applied can be utilized. When the voltage pulses shown in FIG. 14 are applied, the signal charges 8 become likely to be read out to the vertical charge transfer regions 5 during a period ($T_3$) in which only the voltage pulse 25 is applied, as shown in FIG. 15. Thus, signal charges can be read out more stably.

Hereinafter, a method for producing a solid-state image device will be described, in which the distance ($H_1$) between the silicon substrate and the vertical transfer electrode 2 is adjusted so as to be smaller than the distance ($H_2$) between the silicon substrate and the read-out electrode 1.

Figure 16:
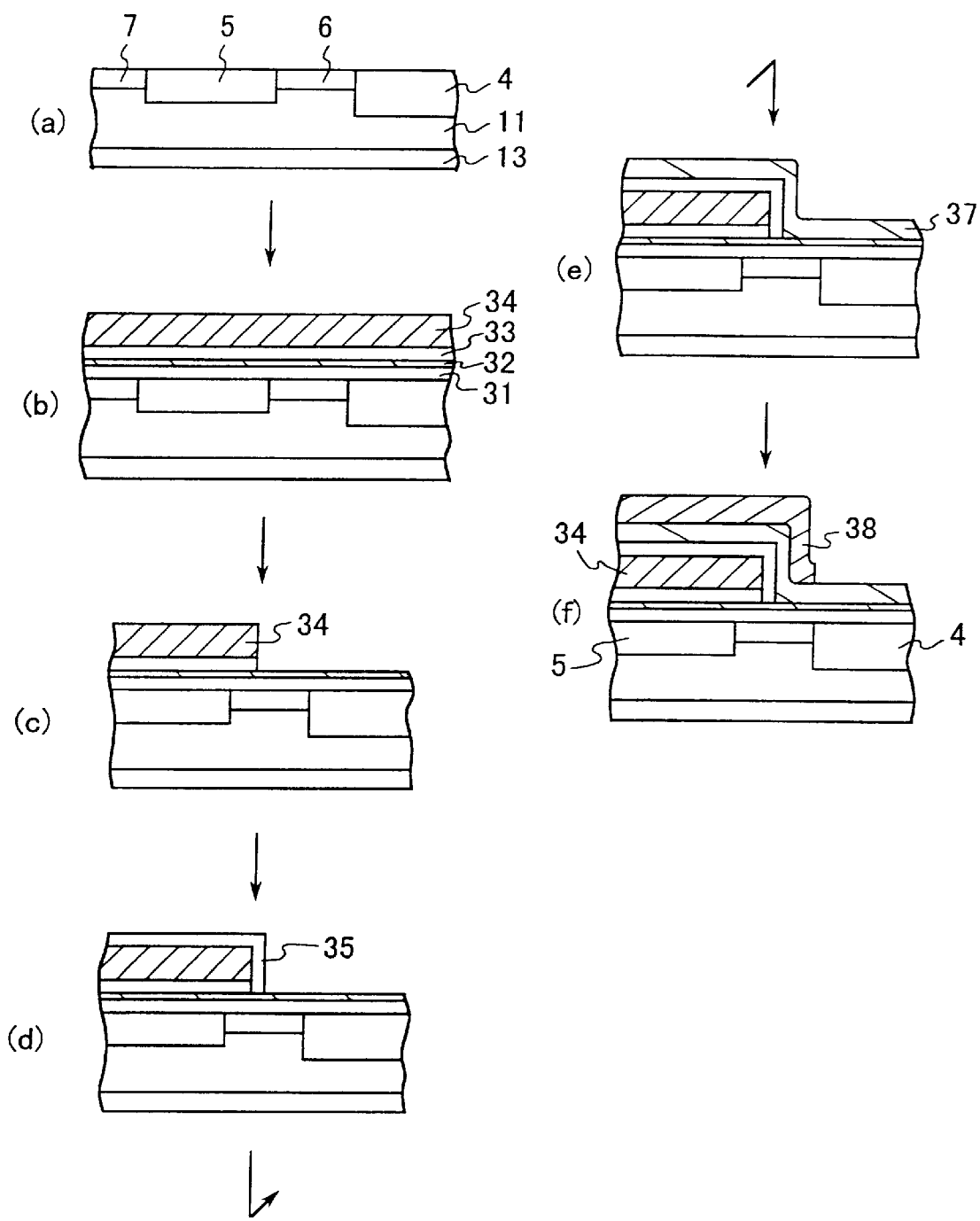
FIG. 16 shows steps for illustrating an example of a method for producing a solid-state image device of the present invention.

Referring to FIG. 16, ions are injected appropriately into a p-type well layer 11 formed on an n-type silicon substrate 13 so as to obtain predetermined n-type or p-type diffusion regions as described above, whereby a photodiode 4, a vertical charge transfer region 5, a charge read-out control region 6, and an isolation region 7 are formed (FIG. 16(a)). Furthermore, a silicon oxide film 31 by thermal oxidation, a silicon nitride film 32 by chemical vapor deposition (CVD), a silicon oxide film 33 by thermal oxidation, and a first polysilicon film 34 by CVD are formed in this order on the surface of the p-type well layer 11 (FIG. 16(b)).

Then, the polysilicon film 34 for a vertical transfer electrode and the silicon oxide film 33 are removed by etching from above the photodiode 4 and a part of the charge read-out control region 6 (FIG. 16(c)). Furthermore, the polysilicon film 34 for a vertical transfer electrode is oxidized thermally to form a silicon oxide film 35 (FIG. 16(d)).

Herein, if a polysilicon film is formed directly on the silicon oxide film 35 thus obtained, and removed from above the photodiode 4 to provide a polysilicon film to be a first vertical transfer electrode and a polysilicon film to be a read-out electrode, a solid-state image device satisfying $H_1 > H_2$ will be obtained. The driving method of the present invention also is applicable to such a solid-state image device.

However, in the steps shown in FIG. 16, in order to satisfy $H_1 < H_2$, another layer is formed at least above the charge read-out control region 6. Specifically, after a silicon nitride film 37 is grown on the silicon oxide film 35 by CVD (FIG. 16(e)), a polysilicon film 38 for a read-out electrode is formed, whereby the distance between the polysilicon film for a vertical transfer electrode (vertical transfer electrode film) 34 and the silicon substrate is set to be smaller relative to the distance between the polysilicon film for a read-out electrode (read-out electrode film) 38 and the silicon substrate (FIG. 16(f)).

Although omitted in the above, the steps of forming a second vertical transfer electrode 3, a light-blocking film 10, and the like are appropriately added to the above-mentioned steps, whereby a solid-state image device is produced. Furthermore, the structures of the insulating films 31, 32, 33 formed on the silicon substrate in the above-mentioned steps are not limited to those described above. For example, although it is preferable to form the silicon nitride film 32 so as to prevent a so-called gate bird's peak that is likely to be generated in the thermal oxidation step of the first polysilicon film 34, it is not necessarily required.

Figure 17:
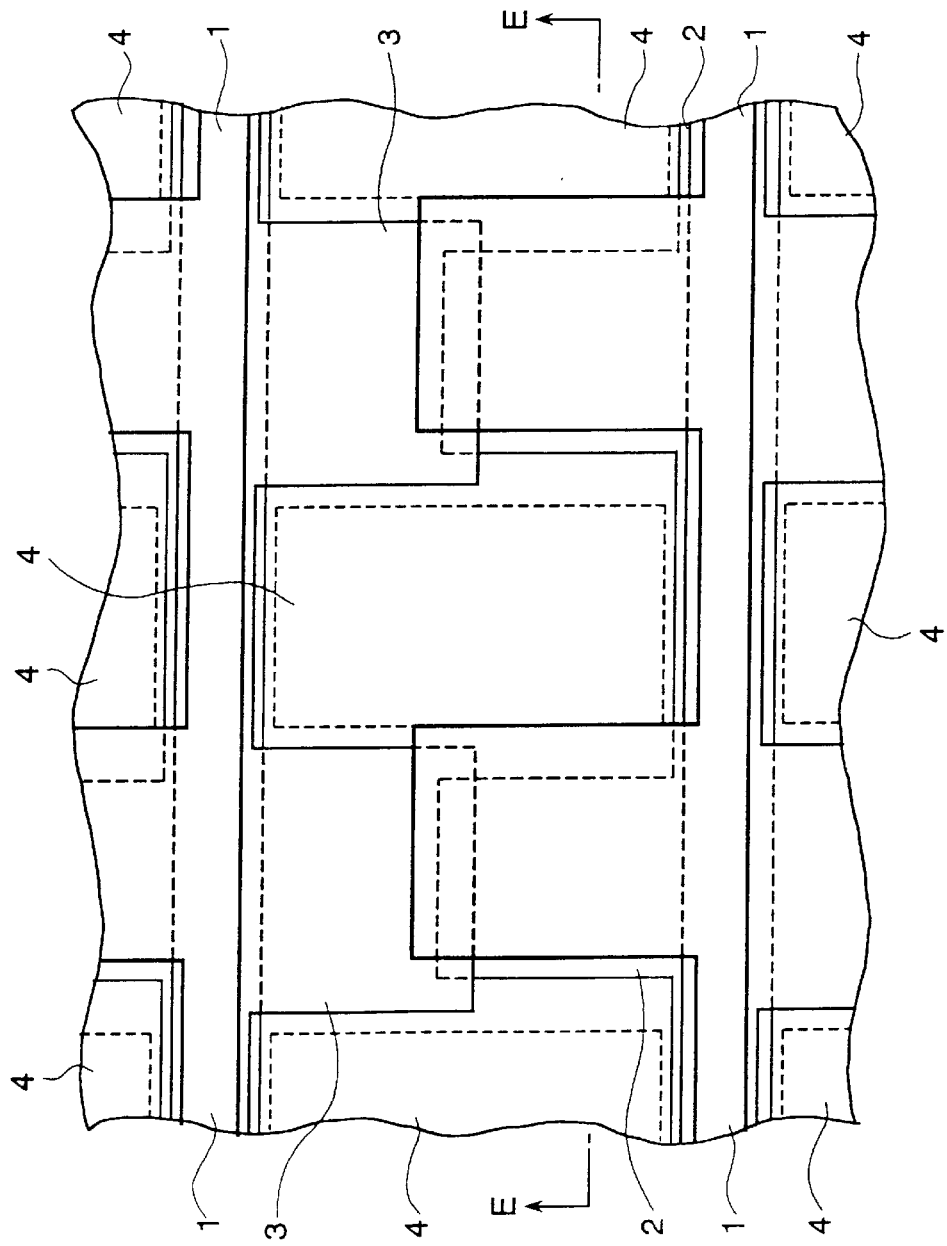
FIG. 17 is a plan view showing still another embodiment of a solid-state image device used in the present invention.

Furthermore, the driving methods of the first to third embodiments also are applicable to a solid-state image device in which the read-out electrodes 1 are arranged in a horizontal direction orthogonal to the vertical transfer direction as shown in FIG. 17. When the read-out electrodes 1 are arranged in a horizontal direction, signal charges only in pixels in a required line can be read out among those arranged in a vertical direction. Thus, this structure also is applicable to a mode in which pixels are thinned out, such as a monitor mode. The cross-section taken along E—E in FIG. 17 is the same as that in FIG. 2.

Embodiment 4

In the present embodiment, still another method for driving a solid-state image device described in the above-mentioned embodiments will be described. Herein, a driving method for reading out signal charges partially will be described. According to this driving method, signal charges also are read out partially in a stable manner.

Figure 18:
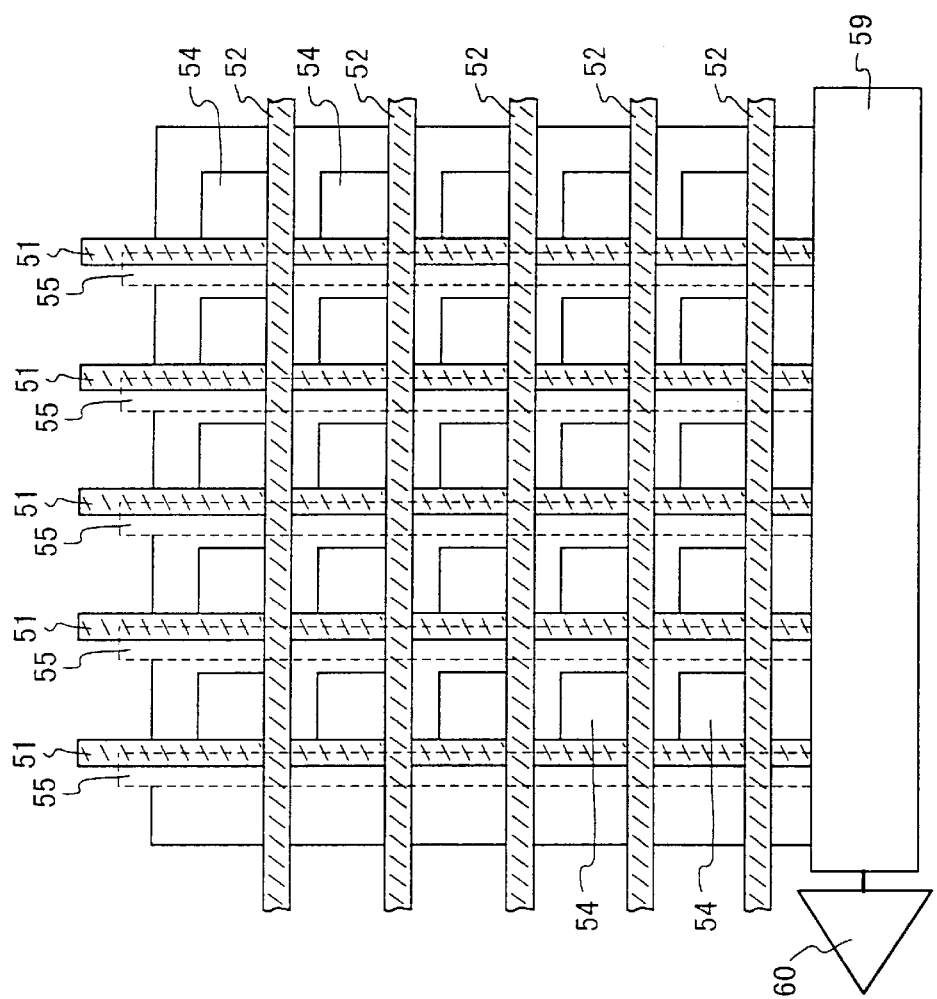
FIG. 18 is a plan view showing still another embodiment of a solid-state image device used in the present invention.

Unlike FIG. 17, in the present embodiment, a solid-state image device is used in which read-out electrodes are arranged in parallel with each other in a vertical transfer direction. In this solid-state image device, as shown in FIG. 18, read-out electrodes 51 are arranged so as to be orthogonal to vertical transfer electrodes 52. Vertical charge transfer regions 55 extend in a column direction along with the read-out electrodes 51. Signal charges read out from the photodiodes 54 and transferred in the vertical charge transfer regions 55 are further transferred in a horizontal charge transfer region 59 (which is not shown or described in the above) and output through an output amplifier 60. In FIG. 18, the shapes of the respective electrodes are not shown in detail; however, for example, it is possible to form the vertical transfer electrode 52 in the same shape as that of the vertical transfer electrode 2 shown in FIGS. 1 to 3.

Figure 19:
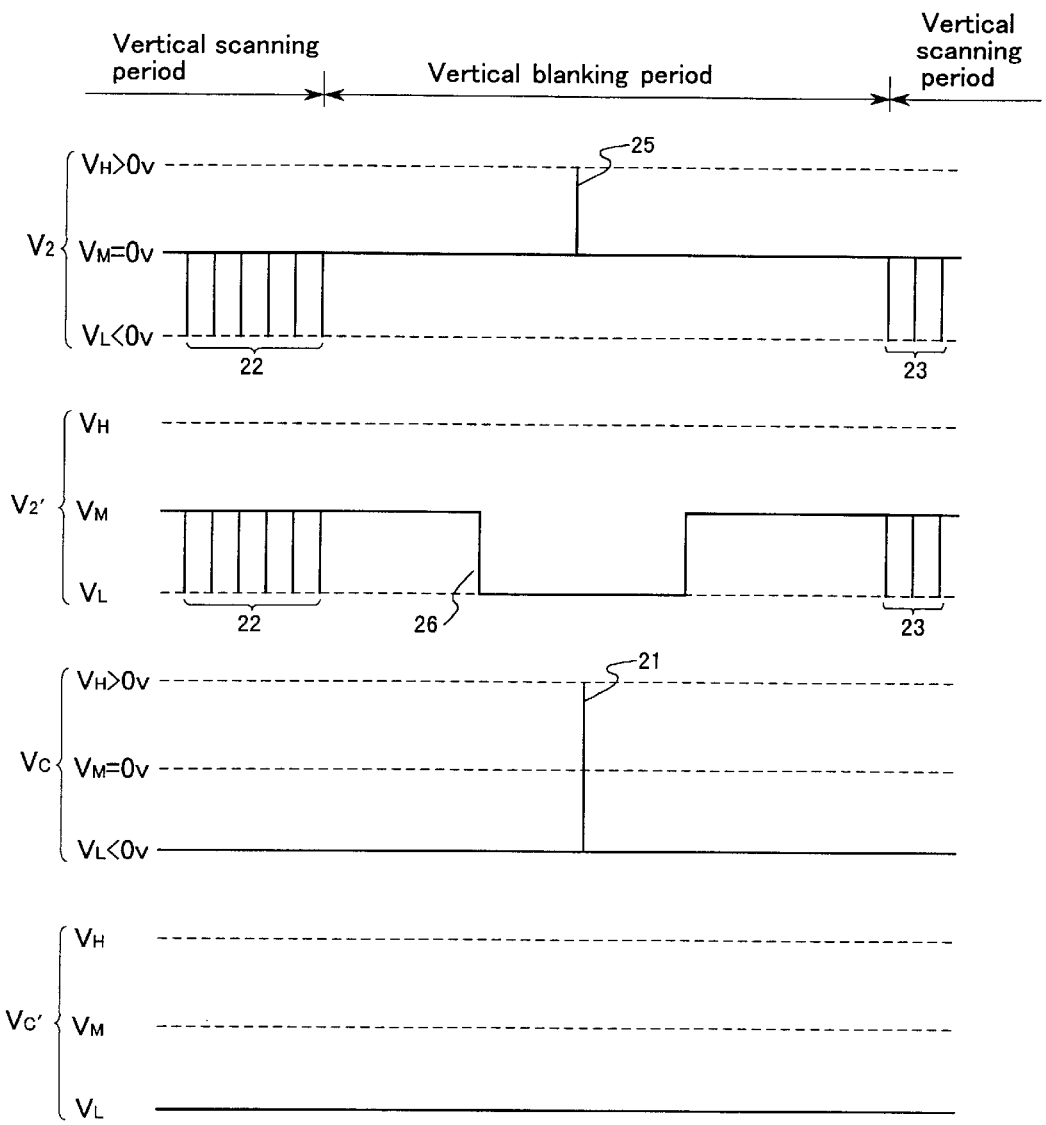
FIG. 19 shows application patterns of voltage pulses in still another embodiment of a method for driving a solid-state image device of the present invention.

As shown in FIG. 19, in the present embodiment, either of two kinds of patterns is applied to the vertical transfer electrodes and the read-out electrodes, respectively. Unlike the conventional example, during a vertical blanking period, a read-out voltage pulse 25 is applied ($V_2$) to some of the vertical transfer electrodes, and a negative voltage 26 is applied ($V_2'$) to others of the vertical transfer electrodes. Because of the application of the negative voltage 26 to the vertical transfer electrodes, signal charges are prevented from reading out from photodiodes adjacent to the vertical transfer electrodes to which the negative voltage 26 is applied.

Furthermore, in the same way as in the conventional example, a read-out voltage pulse 21 is applied ($V_C$) to some of the read-out electrodes, whereas the read-out voltage pulse is not applied ($V_C'$) to others of the read-out electrodes. In the same way as in the above embodiments, the read-out electrodes are held at a negative electric potential $V_L$ ($V_C$, $V_C'$) during a vertical scanning period.

Figure 20:
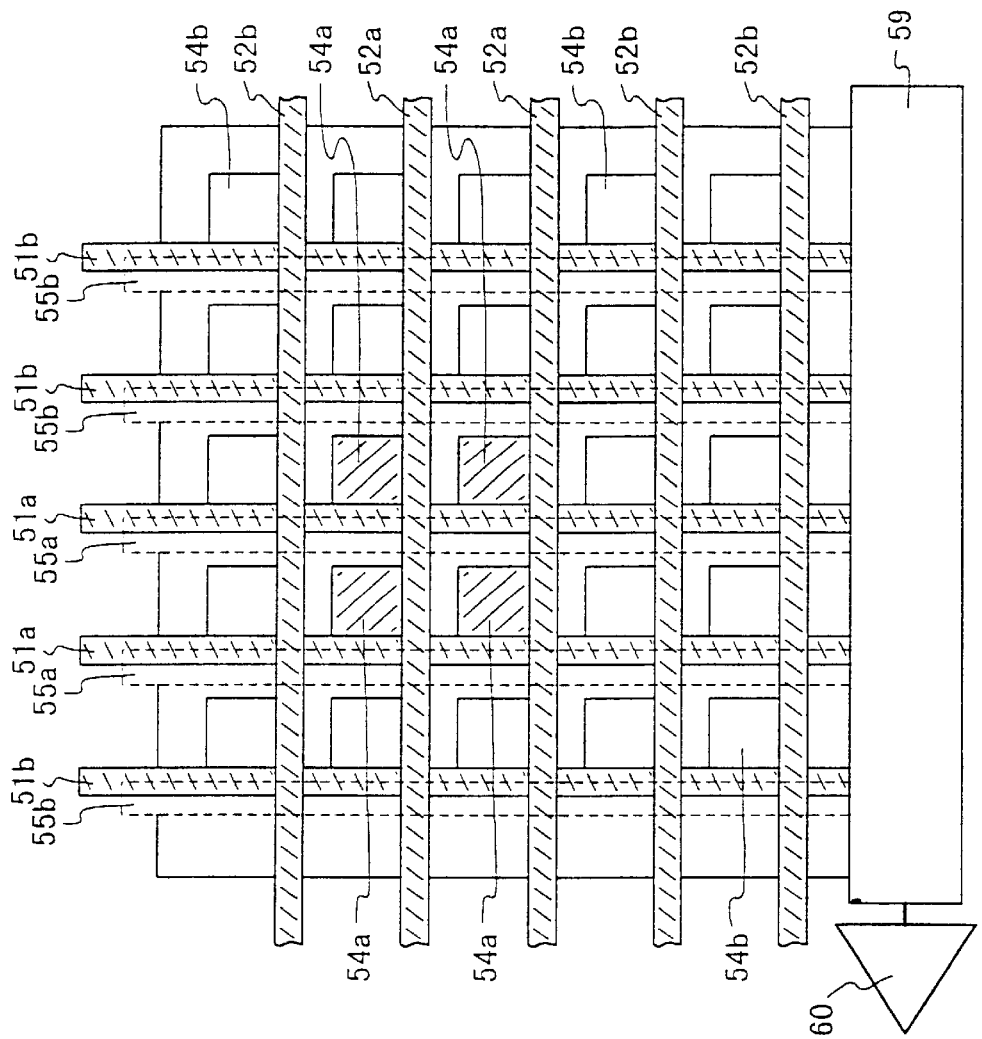
FIG. 20 is a plan view showing a predetermined region for reading out signal charges in the solid-state image device shown in FIG. 18.

When these patterns are applied, signal charges can be read out from photodiodes only in a predetermined region. For example, referring to FIG. 20, when $V_C$ is applied to read-out electrodes 51a, $V_C'$ is applied to read-out electrodes 51b, $V_2$ is applied to vertical transfer electrodes 52a, and $V_2'$ is applied to vertical transfer electrodes 52b, signal charges are read out from photodiodes 54a, whereas signal charges are not read out from photodiodes 54b. Assuming that a group of a plurality of electrodes adjacent to each other are denoted as a column group or a row group depending upon the direction in which the electrodes extend, a region where the read-out electrodes 51a forming a column group cross the vertical transfer electrodes 52a forming a row group can be specified as a read-out region of signal charges. Herein, the case where signal charges are read out from one region has been described; however, signal charges may be read out simultaneously from a plurality of regions.

In order to read out signal charges from a predetermined region, it is not necessarily required to apply a negative voltage to read-out electrodes (for example, $V_L$ may be set at 0 in $V_C$ and $V_C'$ in FIG. 19). Similarly, it is not necessarily required to apply a read-out voltage pulse to vertical transfer electrodes (the voltage pulse 25 may be omitted in $V_2$ in FIG. 19).

As represented by $V_C'$ in FIG. 19, when a negative voltage is applied to read-out electrodes during a vertical blanking period, leakage of signal charges from the photodiodes 54b can be prevented without fail. Furthermore, when a negative voltage is applied to a plurality of vertical transfer electrodes (the vertical transfer electrodes 3 in addition to the vertical transfer electrodes 2 in the embodiment shown in FIGS. 1 to 3) corresponding to one light-receiving portion, leakage of signal charges can be prevented more reliably. In contrast, when the read-out voltage pulse 25 is applied to the vertical transfer electrodes as represented by $V_2$ in FIG. 19, signal charges can be read out more efficiently.

As is apparent from the above description, when voltages are applied as shown in FIG. 19, signal charges are read out partially while preventing leakage of signal charges from non-active photodiodes without fail. This is because, during a vertical blanking period, a negative voltage is applied ($V_2'$ and $V_C'$) to the vertical transfer electrodes and/or the read-out electrodes adjacent to the photodiodes 54b in non-active regions.

Such stabilization of partial read-out also is applicable to read-out of signal charges from a predetermined column (row). For example, when a read-out voltage pulse ($V_C$) is applied to read-out electrodes adjacent to photodiodes in an active column, a negative voltage ($V_C'$) is applied to read-out electrodes adjacent to photodiodes in non-active columns, and a negative voltage is not applied to any of the vertical transfer electrodes during read-out of signal charges, signal charges can be read out partially from the photodiodes in a predetermined column. Furthermore, for example, when the negative voltage 26 ($V_2'$) is applied to vertical transfer electrodes adjacent to photodiodes in non-active rows, the negative voltage is not applied (for example, held at 0 volt) to vertical transfer electrodes adjacent to photodiodes in an active row, and the read-out voltage pulse 21 is applied ($V_C$) to any of the read-out electrodes, signal charges can be read out partially from photodiodes in a predetermined row.

Figure 21:
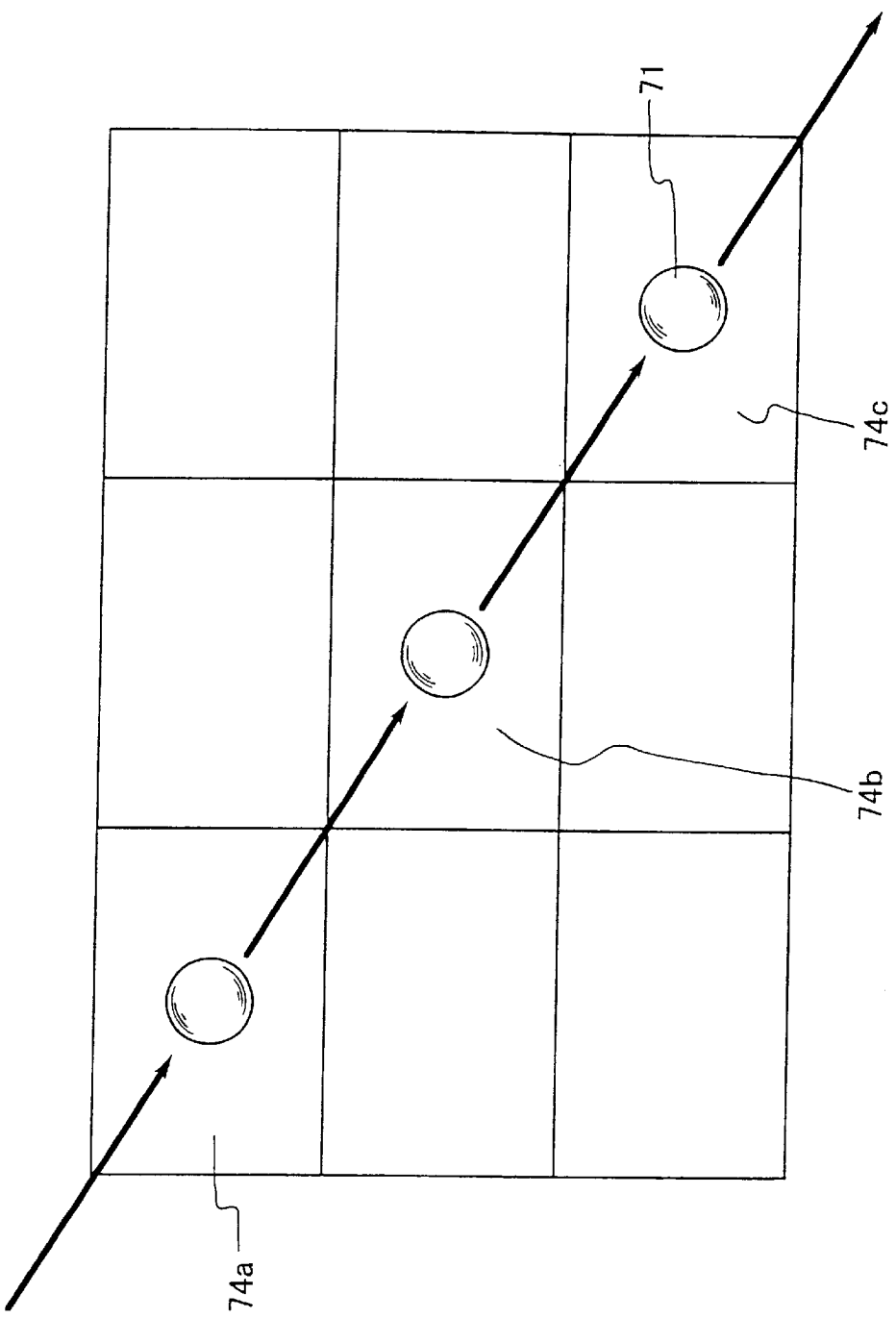
FIG. 21 is a plan view illustrating movement of a predetermined region for reading out signal charges.

When partial read-out from photodiodes in a predetermined region described in the present embodiment is used, a subject 71 moving at a high speed can be captured continuously and displayed in one frame of an image, as shown in FIG. 21. In this case, active regions 74a, 74b, and 74c should be moved in synchronization with the subject 71. According to this driving, an entire region is not required to be read out a plurality of times. Therefore, signal charges are less likely to overflow the vertical charge transfer regions. Furthermore, since signal charges can be read out from a predetermined region that can be determined arbitrarily, a movement direction of these regions can be set arbitrarily.

Furthermore, regarding a plurality of predetermined regions, an accumulation time for signal charges may be set appropriately for each region. For example, simply by setting an accumulation time to be shorter for a light region (receiving a large amount of incident light), and to be longer for a dark region, sensitivity can be improved while preventing the saturation of the photodiodes and vertical charge transfer regions. Therefore, a dynamic range of a solid-state image device can be expanded. Furthermore, an accumulation time can be shortened in regions to be synchronized with a high-speed subject as described above, compared with other regions.

The driving methods described in each embodiment can be combined appropriately.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A method for driving a solid-state image device comprising:
    a plurality of light-receiving portions formed in a semiconductor substrate in a matrix having a plurality of rows and columns;
    a plurality of vertical charge transfer regions formed in the semiconductor substrate so as to extend between the light-receiving portions along the columns thereof;
    a plurality of vertical transfer electrodes disposed on the semiconductor substrate so as to apply a voltage for transferring signal charges in the vertical charge transfer regions in a column direction;
    a plurality of charge read-out control regions formed in the semiconductor substrate between the light-receiving portions and the vertical charge transfer regions; and
    a plurality of read-out electrodes disposed on the semiconductor substrate so as to apply a voltage to the charge read-out control regions, for reading out signal charges accumulated in the light-receiving portions from the light-receiving portions to the vertical charge transfer regions via the charge read-out control regions,
    the method comprising:
        reading out signal charges accumulated in the light-receiving portions to the vertical charge transfer regions via the charge read-out control regions by applying a read-out voltage pulse to the read-out electrodes during a first period; and
        transferring the signal charges in the vertical charge transfer regions in the column direction by applying a transfer voltage pulse to the vertical transfer electrodes during a second period,
        wherein a negative voltage is applied to the read-out electrodes at least during the second period.

2. A method for driving a solid-state image device according to claim 1, wherein, during at least a part of the first period, the read-out electrodes are held at an intermediate electric potential lower than a peak electric potential of the read-out voltage pulse and higher than an electric potential of the negative voltage applied to the read-out electrodes.

3. A method for driving a solid-state image device according to claim 1, in which the read-out electrodes are disposed so as to spread over the vertical transfer electrodes.

4. A method for driving a solid-state image device comprising:
    a plurality of light-receiving portions formed in a semiconductor substrate in a matrix having a plurality of rows and columns;
    a plurality of vertical charge transfer regions formed in the semiconductor substrate so as to extend between the light-receiving portions along the columns thereof;
    a plurality of vertical transfer electrodes disposed on the semiconductor substrate so as to apply a voltage for transferring signal charges in the vertical charge transfer regions in a column direction;
    a plurality of charge read-out control regions formed in the semiconductor substrate between the light-receiving portions and the vertical charge transfer regions; and
    a plurality of read-out electrodes disposed on the semiconductor substrate so as to apply a voltage to the charge read-out control regions, for reading out signal charges accumulated in the light-receiving portions from the light-receiving portions to the vertical charge transfer regions via the charge read-out control regions,
    the method comprising:
        reading out signal charges accumulated in the light-receiving portions to the vertical charge transfer regions via the charge read-out control regions by applying a first read-out voltage pulse to the read-out electrodes and applying a second read-out voltage pulse to the vertical transfer electrodes during a first period; and
        transferring the signal charges in the vertical charge transfer regions in the column direction by applying a transfer voltage pulse to the vertical transfer electrodes during a second period, wherein a voltage of the first read-out voltage pulse is set to be lower than a voltage of the second read-out voltage pulse.

5. A method for driving a solid-state image device according to claim 4, wherein the vertical transfer electrodes are disposed so as to spread over a part of the charge read-out control regions as well as the vertical charge transfer regions.

6. A method for driving a solid-state image device according to claim 4, in which the read-out electrodes are disposed so as to spread over the vertical transfer electrodes.

7. A method for driving a solid-state image device comprising:

a plurality of light-receiving portions formed in a semiconductor substrate in a matrix having a plurality of rows and columns;

a plurality of vertical charge transfer regions formed in the semiconductor substrate so as to extend between the light-receiving portions along the columns thereof;

a plurality of vertical transfer electrodes disposed on the semiconductor substrate so as to apply a voltage for transferring signal charges in the vertical charge transfer regions in a column direction;

a plurality of charge read-out control regions formed between the light-receiving portions and the vertical charge transfer regions in the semiconductor substrate; and a plurality of read-out electrodes disposed on the semiconductor substrate so as to apply a voltage to the charge read-out control regions, for reading out signal charges accumulated in the light-receiving portions from the light-receiving portions to the vertical charge transfer regions via the charge read-out control regions, the method comprising:

reading out signal charges accumulated in the light-receiving portions to the vertical charge transfer regions via the charge read-out control regions by applying a first read-out voltage pulse to the read-out electrodes and applying a second read-out voltage pulse to the vertical transfer electrodes during a first period; and transferring the signal charges in the vertical charge transfer regions in the column direction by applying a transfer voltage pulse to the vertical transfer electrodes during a second period, wherein application of the first read-out voltage pulse is completed while the second read-out voltage pulse is applied.

8. A method for driving a solid-state image device according to claim 7, wherein the vertical transfer electrodes are disposed so as to spread over a part of the charge read-out control regions as well as the vertical charge transfer regions.

9. A method for driving a solid-state image device according to claim 7, in which the read-out electrodes are disposed so as to spread over the vertical transfer electrodes.

10. A method for driving a solid-state image device comprising:

a plurality of light-receiving portions formed in a semiconductor substrate in a matrix having a plurality of rows and columns;

a plurality of vertical charge transfer regions formed in the semiconductor substrate so as to extend between the light-receiving portions along the columns thereof;

a plurality of vertical transfer electrodes disposed on the semiconductor substrate so as to apply a voltage for transferring signal charges in the vertical charge transfer regions in the column direction;

a plurality of charge read-out control regions formed in the semiconductor substrate between the light-receiving portions and the vertical charge transfer regions; and a plurality of read-out electrodes disposed on the semiconductor substrate so as to apply a voltage to the charge read-out control regions, for reading out signal charges accumulated in the light-receiving portions from the light-receiving portions to the vertical charge transfer regions via the charge read-out control regions, the method comprising:

reading out signal charges accumulated in at least a part of the light-receiving portions to the vertical charge transfer regions via the charge read-out control regions by applying a read-out voltage pulse to at least a part of the read-out electrodes during a first period; and transferring the signal charges in the vertical charge transfer regions in the column direction by applying a transfer voltage pulse to the vertical transfer electrodes during a second period, wherein, when the read-out voltage pulse is applied during the first period, a negative voltage is applied to at least one of electrode groups selected from the read-out electrodes excluding read-out electrodes to which the read-out voltage pulse is applied and a part of the vertical transfer electrodes.

11. A method for driving a solid-state image device according to claim 10, in which the read-out electrodes are disposed so as to spread over the vertical transfer electrodes.

12. A method for driving a solid-state image device comprising:

a plurality of light-receiving portions formed in a semiconductor substrate in a matrix having a plurality of rows and columns;

a plurality of vertical charge transfer regions formed in the semiconductor substrate so as to extend between the light-receiving portions along the columns thereof;

a plurality of vertical transfer electrodes disposed on the semiconductor substrate so as to apply a voltage for transferring signal charges in the vertical charge transfer regions in a column direction;

a plurality of charge read-out control regions formed in the semiconductor substrate between the light-receiving portions and the vertical charge transfer regions; and a plurality of read-out electrodes disposed on the semiconductor substrate so as to apply a voltage to the charge read-out control regions, for reading out signal charges accumulated in the light-receiving portions from the light-receiving portions to the vertical charge transfer regions via the charge read-out control regions, and arranged so as to be orthogonal to an arrangement of the vertical transfer electrodes, the method comprising:

reading out signal charges accumulated in at least a part of the light-receiving portions to the vertical charge transfer regions via the charge read-out control regions by applying a read-out voltage pulse to at least a part of the read-out electrodes during a first period; and transferring the signal charges in the vertical charge transfer regions in the column direction by applying a transfer voltage pulse to the vertical transfer electrodes during a second period, wherein, when the read-out voltage pulse is applied during the first period, a negative voltage is applied to a first group of the vertical transfer electrodes, thereby preventing read-out of signal charges from the first group of the light-receiving portions, while allowing signal charges to be read out from a second group of the light-receiving portions that form a predetermined row group, and the read-out voltage pulse is applied to a part of the read-out electrodes that form a predetermined column group, whereby the signal charges are read out from the second group of the light-receiving portions in a predetermined region determined as a position where the predetermined row group crosses the predetermined column group.

13. A method for driving a solid-state image device according to claim 12, wherein, while the predetermined region for reading signal charges is moved in a predetermined direction, the signal charges are read out from the predetermined region.

14. A method for driving a solid-state image device according to claim 12, wherein a plurality of predetermined regions having different accumulation times for signal charges are set.

15. A method for driving a solid-state image device according to claim 12, in which the read-out electrodes are disposed so as to spread over the vertical transfer electrodes.

* * * * *